(12) United States Patent  
Kolze

(10) Patent No.: US 9,379,741 B2  
(45) Date of Patent: Jun. 28, 2016

(54) MEMORY DEPTH OPTIMIZATION IN COMMUNICATIONS SYSTEMS WITH ENSEMBLE PHY LAYER REQUIREMENTS

(75) Inventor: Thomas J. Kolze, Phoenix, AZ (US)

(73) Assignee: Broadcom Corporation, Irvine, CA (US)

( * ) Notice: Subject to any disclaimer, the term of this patent is extended or adjusted under 35 U.S.C. 154(b) by 2252 days.

(21) Appl. No.: 12/370,600

(22) Filed: Feb. 13, 2009

(65) Prior Publication Data

US 2009/0204772 A1 Aug. 13, 2009

Related U.S. Application Data

(60) Provisional application No. 61/028,488, filed on Feb. 13, 2008.

(51) Int. Cl.
| | |
|---|---|
| *G06F 15/16* | (2006.01) |
| *H03M 13/00* | (2006.01) |
| *H03M 13/11* | (2006.01) |
| *H03M 13/15* | (2006.01) |
| *H03M 13/27* | (2006.01) |
| *H03M 13/29* | (2006.01) |
| *H03M 13/35* | (2006.01) |

(52) U.S. Cl.
CPC ...... *H03M 13/6513* (2013.01); *H03M 13/6505* (2013.01); *H03M 13/6516* (2013.01); *H03M 13/1102* (2013.01); *H03M 13/1515* (2013.01); *H03M 13/2732* (2013.01); *H03M 13/2957* (2013.01); *H03M 13/35* (2013.01)

(58) Field of Classification Search
USPC .......................................... 709/230; 711/157
See application file for complete search history.

(56) References Cited

U.S. PATENT DOCUMENTS

| | | | | |
|---|---|---|---|---|
| 5,898,698 | A * | 4/1999 | Bross | 714/701 |
| 2002/0172275 | A1 * | 11/2002 | Birru | 375/233 |
| 2008/0112472 | A1 * | 5/2008 | Oksman et al. | 375/222 |
| 2008/0130548 | A1 * | 6/2008 | Kaikkonen et al. | 370/312 |

* cited by examiner

*Primary Examiner* — Chris Parry
*Assistant Examiner* — Alan S Chou
(74) *Attorney, Agent, or Firm* — Garlick & Markison; Shayne X. Short

(57) ABSTRACT

Memory depth optimization in communications systems with ensemble PHY layer requirements. Memory depth, for one or more modules in a communication device, is managed based on a limited amount of provisioned hardware. For example, each of a number of various modules within a communication device is configurable to operate at various memory depths. Considered together, various sets or profiles of operational parameters (e.g., associated with particular settings for each of the various modules within the communication device), may be employed to configure the communication device to operate in accordance with one of a variety of operational modes. For example, in a first operational mode, latency may be minimized (e.g., using shorted codewords, shorter interleaver depth, etc.), whereas in a second operational mode, a higher latency may be tolerated but with an expectation of much lower error rates (e.g., achieved using more powerful ECC, longer interleaver depth, etc.).

29 Claims, 18 Drawing Sheets

MEMORY DEPTH OPTIMIZATION IN COMMUNICATIONS SYSTEMS WITH ENSEMBLE PHY LAYER REQUIREMENTS

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Application Ser. No. 61/028,488, entitled "Apparatus and method for optimizing memory depth in communications systems with ensemble PHY layer requirements," filed Feb. 13, 2008, pending.

BACKGROUND OF THE INVENTION

1. Technical Field of the Invention

The invention relates generally to configuring and managing available resources; and, more particularly, it relates to configuring and managing available resources within a communication device.

2. Description of Related Art

Data communication systems have been under continual development for many years. Generally speaking, within the context of communication systems that employ various types of communication devices, there is a first communication device at one end of a communication channel with encoder capability and second communication device at the other end of the communication channel with decoder capability. In many instances, one or both of these two communication devices includes encoder and decoder capability (e.g., within a bi-directional communication system). Transferring information from one location to another can be applied generally within any type of communication system, including those that employ some form of data storage (e.g., hard disk drive (HDD) applications and other memory storage devices) in which data is processed and/or encoded before writing to the storage media, and then the data is processed and/or decoded after being read/retrieved from the storage media.

Certain communication systems employ one or more of various types of coding (e.g., error correction codes (ECCs) whose decoding may be performed iteratively) to ensure that the data extracted from a signal received at one location of a communication channel is the same information that was originally transmitted from another location of the communication channel. Communications systems with iterative codes are often able to achieve lower bit error rates (BER) than alternative codes for a given signal to noise ratio (SNR).

Within recent developments within some communication systems, there is an ever increasing desire to support various types of services (e.g., voice, data, etc.) over a common communication link. The various standards that operate within such communication systems place requirements and restrictions on the various service flows that operate in accordance with the standard. For example, a physical layer (PHY) device is typically configured and set to operate in accordance with the various physical layer requirements to be compliant with a particular standard (e.g., a corresponding error rate performance (bit error rate (BER), block error rate (BLER), etc.), a corresponding data rate in bits per second, a corresponding modulation, etc.). This problem becomes exacerbated when there are multiple service types and/or service flows being supported between the first communication device and a second communication device. A typical prior art approach by which this may be effectuated is to provision an adequate of functionality (e.g., hardware, software, etc.) within a communication device to support each of these various requirements associated with each of these various types of service flows.

As may be understood, this can be not only extremely costly in terms of real estate/footprint of a device but also in terms of actual dollar cost to implement a device. There simply does not exist an adequate means in the art for supporting various service flows in an efficient and cost effective manner.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
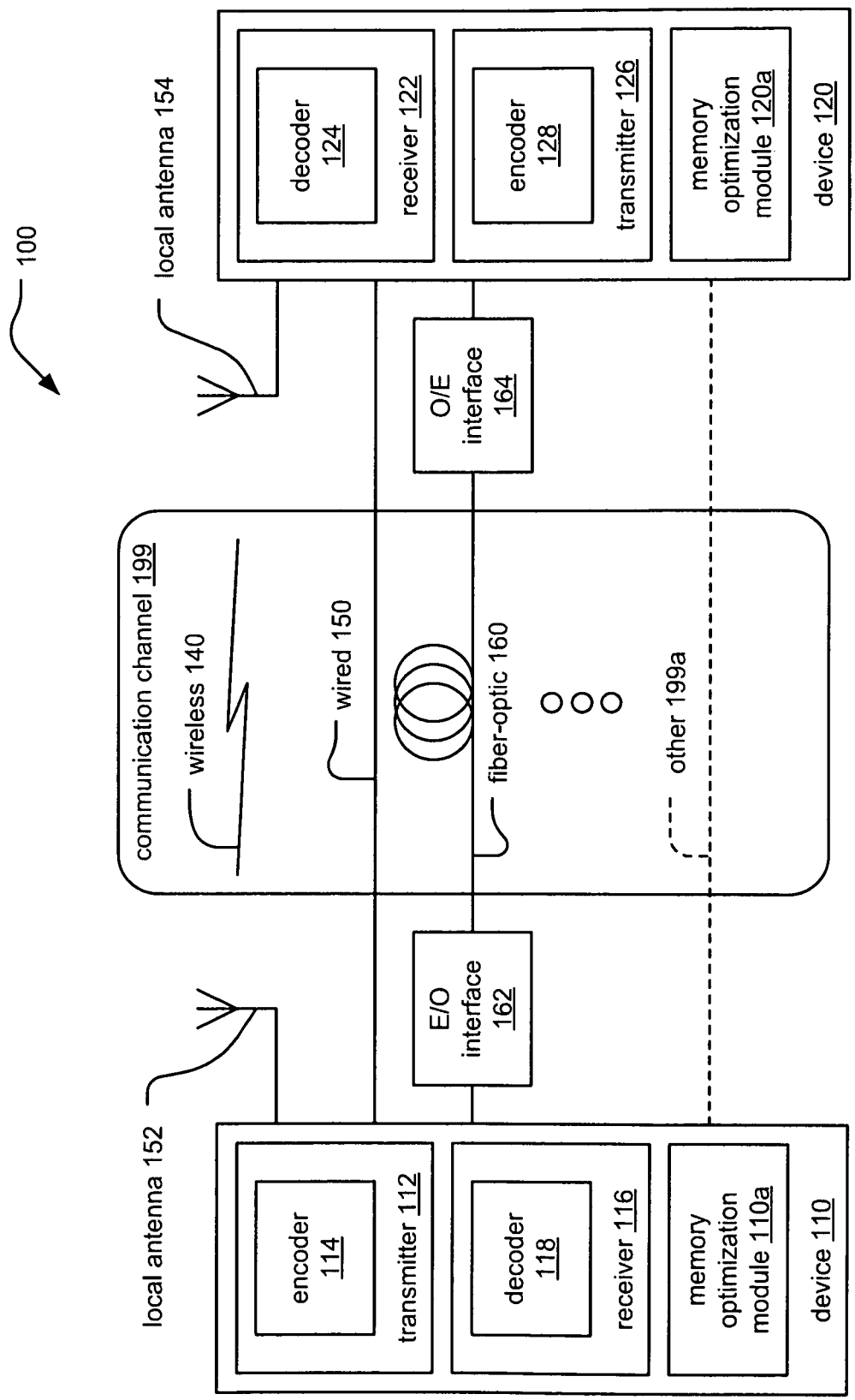
FIG. 1, FIG. 2, and FIG. 3 illustrate various embodiments of communication systems.

Within a device, a memory depth may be associated with the signal that is generated thereby. Typically, many modules within such a device operate in cooperation with one another to generate a signal. As each of these modules is configurable, the memory depth of the device may be adjusted accordingly and the signals generated thereby may each have a different corresponding memory depth. It is noted here that memory depth as described herein is not related to memory alone (i.e., not strictly storage capability), but may be related to a variety of different capabilities that a communication device may have and/or operate in accordance with (e.g., possibly including memory itself, but also including other parameters such as interleaving depth, modulation type, coding type, code rate, block size, data rate, etc.).

Within a particular device, there is of course a finite amount of provisioned resources (e.g., memory, processing capability, etc.), and a novel and efficient means of allocating and applying those provisioned resources, as may be applied across a number of service flows that may be transmitted across one or more communication links, is presented herein.

One aspect presented herein relates to placing a limit or cap on the total provisioned memory depth that is associated with a communication link. This limiting or capping on the total provisioned memory depth may be effectuated at either a transmitter or a receiver on opposite ends of a communication link. Alternatively, this limiting or capping on the total provisioned memory depth may be effectuated cooperatively using both the transmitter and the receiver on opposite ends of a communication link; it is noted that the limiting/governing may be effectuated differently at the transmitter than in the receiver.

It is noted that a different limit/cap on the total provisioned memory depth need not be the same within both a transmitter and a receiver located at different ends of a communication channel. For example, a receiver may have a greater memory depth than the transmitter from which it receives one or more signals. More so, in a communication system including multiple receivers and multiple transmitters (and/or multiple transceivers), each of the various communication devices may have different memory depths. Generally speaking, a transceiver may be referred to as a transmitter and/or a receiver as well, since a transceiver also includes transmitter and receiver capability (i.e., is bi-directional capable). Moreover, a receiver may generally be referred to as a communication device or apparatus that receives signals, and a receiver may also include a receiver module therein in addition to other modules and/or components as well such a decoder, etc. Analogously, a transmitter may generally be referred to as a communication device or apparatus that transmits signals, and a transmitter may also include a transmitter module therein in addition to other modules and/or components as well such an encoder, etc. Clearly, a transceiver may include both receiver and transmitter functionality therein (e.g., and include a receiver module, a transmitter module, as other modules and/or components).

In such multiple communication device embodiments, a given receiver may be operative to receive signals from more than one transmitter. This reception of such signals may be strictly simultaneous in nature, in which at least two signals are received at a same time. Alternatively, the reception of such signals may be instead by using some time-shared access in nature, in which a first signal is received at a first time, and then a second signal is received at a second time; these first and second signals need not be transmitted from the same transmitter.

Moreover, other multiple access schemes are also applicable here that allow a receiver to receive signals from one or more transmitters (e.g., different carrier frequencies, spreading codes, interspersed time-shared symbols or packets, etc.). There are a wide variety of multiple access schemes (e.g., orthogonal frequency division multiplexing (OFDM), code division multiple access (CDMA), synchronous code division multiple access (S-CDMA), time frequency codes, time division multiple access (TDMA), etc.) that may operate in accordance with the principles presented herein. From certain perspectives, such multiple access schemes may also be viewed as allowing for a receiver to effectuate simultaneous reception of signals from one or more transmitters. Some multiple access systems may not necessarily receive two signals at an exact same time, but they do cycle through and access various signals as a function of time (i.e., first part of first signal at time 1, first part of second signal at time 2, second part of first signal at time 3, and second part of second signal at time 4, etc.). This also could be viewed as a simultaneous reception of two or more signals (e.g., or at least partially-simultaneous reception).

Moreover, while certain references to a continuous time signal are employed herein (e.g., being a continuous time/analog signal that is actually launched into a communication channel), it is noted that not all communications are themselves continuous in nature. For example, consider a bursty type of communication (e.g., signals sent from a burst transmitter to one or more burst receivers. While each burst signal actually launched into a communication channel is a continuous time signal, it is finite in duration (e.g., has a finite length). The reader is reminded that while continuous time signals are those transmitted/launched within communication channels, such continuous time signals may not be of infinite duration, of course. From one perspective, a continuous time signal may be viewed as being an analog signal launched into a communication channel.

A communication link may be viewed as being one communication channel or a collection of communication channels connecting a transmitter and a receiver. Typically, communication links are constrained by many considerations. For example, if they operate in accordance with a protocol or communications standard, the communication link must comply with those requirements.

In one communication system embodiment, the total interleaver depth may be viewed as whatever is the largest possibility of all combinations of the multiple service flows which can be accommodated (without consideration of interleaver depth). From this perspective, this total interleaver depth (corresponding to total memory depth in this embodiment) is a limiting factor that allows or prohibits certain service flows to be supported.

By provisioning a total memory depth within a device that is less than a maximum allowable per signal memory depth (or per service flow, or per communication link) times a total number of signals (or times a total number of service flow, or times a total number of communication links), a reduced and more efficient provisioning of hardware within a device is achieved. From another perspective, each of the signals may not be generated using a maximum per signal memory depth. As such, intelligent management of the finite amount of provisioned resources is effectuated based on any number of considerations.

This memory depth optimization is applicable across a wide spectrum of applications, including the development of communications standards, communication systems, transmitters and receivers, and communication link and system operations. This will provide improved operation by providing highly capable, multiple service flow systems, which generally have lower overall complexity or cost (due to limit on provisioned memory depth [e.g., being interleaver depth in one embodiment]).

In many developing standardized communications systems, multiple services (multiple service flows) are to be transmitted within a single communication standard. For one example, voice, video, and Internet browsing are all to be carried in one communication "channel" between a source (e.g., such as cable Head End device or cellular Base Station) and an end user (such as cable modem or cell phone).

In many past communication standards, such as Data Over Cable Service Interface Specification (DOCSIS) downstream, there is one physical layer requirement for error rate performance (Bit Error Rate), the data rate is fixed on a channel (e.g., either 64 QAM or 256 QAM, each with their data rates of roughly 27 Mbps and 38 Mbps, respectively), and latency is fixed on a given channel but is selectable from a table of different interleaving depths, with added burst noise protection provided by increased interleaver depth but with increased latency for the longer depths.

However, in future developing standards, in fact even in DOCSIS 3.0, there is a recognition that multiple services will be supported commonly. In DOCSIS 3.0, multiple channels are required for both the transmitter and receiver, so, in general, the transmitter and receiver are providing multiple services "simultaneously" even if not in the same channel. In DOCSIS 3.0, and certainly in future communication systems, multiple services will be provided simultaneously, and perhaps even within a single channel.

Typically, each service type (e.g., audio, video, data, etc.) has its own unique set of requirements in regards to the physical (PHY) layer: data rate (also known as throughput), error performance, latency, and/or other operational parameters. In communications standards developed in the future, one design approach is to capture the PHY layer performance for each of the services to be carried individually, rather than attempt to capture a common set (e.g., data rate, error performance, and latency) for a given communication link.

Within certain communication standards, the approach is to accommodate different and respective communication profiles for servicing different communication link characteristics/impairments/fidelity and service requirements, so that the link may be optimized within the standard, in terms of the PHY layer adapting (data rate, error performance, and latency) to the various service requirements and channel conditions. Considering one example of DOCSIS 1.0, this adaptation was in the form of the communication standard providing different burst profiles for different types of traffic, which could be used alternately (e.g., employing different profiles that vary from burst to burst) depending on which type of traffic the burst was carrying. As channel conditions change, the burst profiles for each type of traffic could be changed, as well. However, such previously developed communication standards may not be able to deal fully or service fully the various and upcoming requirements of newly developed communication systems, including those that seek to support multiple service flows.

When considering the development of future communication systems, there will continue to be multiple services carried simultaneously therein through a communication link with one or more communication channels. All at one time, the communication link (system) will support a variety of services, and each will have its unique set of PHY requirements, which the communications waveforms will be optimized to provide, with a different waveform (potentially) for each different service. This may be described as being an ensemble of PHY layer requirements (e.g., a plurality of PHY layer requirements each corresponding to a particular component of such a communications protocol).

In certain communication systems that operate in accordance with burst communications, a received burst is processed fully before and prior to the reception of a subsequent burst. However with fragmentation, this is not necessarily the case. As also described elsewhere herein (e.g., with respect to buffering module functionality with reference to FIG. 8.), one or more bursts may take a longer time to process in a receiver than others. For example, perhaps a receiver is unable to decode a signal quickly and (e.g., in the context of an iterative error correction code (ECC) scheme) perhaps multiple (more than usual a number of) decoding iterations are needed. In such a case, it may take longer (even substantially longer) to finish processing a received burst before a subsequent burst is received by the receiver. In such an instance, intelligent buffering is implemented at the receiver, and also feedback may be provided from the receiver to the transmitter to indicate the operational status of the receiver (e.g., whether or not additional burst should be delayed for some period of time [such as predetermined period or adaptively determined based on additional parameters, etc.], or may be transmitted, etc.).

In accordance with this, the use of re-transmission may be employed. For example, in some instances, a signal may not be able to be decoded at the receiver, and a request for a re-transmission may be made from the receiver to the transmitter to request that all or a part of the signal be re-sent. When multiple repeat transmissions are employed, buffering at the receiver may be one aspect of memory depth used to accommodate such transmissions. This resource of buffering capability may be shared among multiple users (the communication devices corresponding thereto) and/or service flows. The memory depth of this provisioned buffering capability may be limited or capped at less than would be required by a maximum need to service all service flows at a time (or substantially contemporaneously). Generally speaking, in various embodiments presented herein, the provisioned memory depth within a device or provisioned for a group of devices (as in an embodiment where multiple devices share memory depth) may be limited or capped at less than would be required by a maximum need to service all service flows at a time (or substantially contemporaneously).

These communication systems may consist of a transmitter transmitting on one or more channels, and these multiple service flows are carried simultaneously, and not just sequentially in one burst of one type and then another burst of another type (e.g., which was the case in DOCSIS 1.0 upstream and then ensuing standards, even with continuous transmission rather than burst).

These communication systems operating in accordance with any embodiment of memory depth optimization as described herein may consist of a receiver receiving the full transmission, or just a part of the transmission, but in general a receiver will be receiving multiple service flows "simultaneously" as well, even if a subset of what is transmitted.

In these future developed communication systems, there will most likely be a number of different service requirements for various services (e.g., 10 Mbps and 100 milliseconds latency for service A, and 20 Mbps and 10 milliseconds latency for service B, etc.). In such future communication systems, the actual throughput (e.g., data rate of payload delivered to user) may vary depending on the channel fidelity and the service type being carried. Some service types may have more demanding requirements and thus the PHY layer may not be able to provide as much throughput in a given channel for one service compared to another.

In any case, in general, with reference to the illustrative example just above, consider that one exemplary PHY channel can carry 5 service A flows (50 Mbps total) or 3 service B flows (60 Mbps total). This also applies for more than one PHY channel, such as an assortment of communication channels if multiple communication channels are "bonded" or transmitted/received simultaneously. It is noted that "hopping" is a form of continuous transmission on one channel and changing the frequency assignment of multiple channels to improve diversity is still multiple channel transmission. OFDM may be considered as either a single channel or multiple channels from certain perspectives. Regardless of whether a communication channel is a single channel or multiple channels, the various principles of memory depth optimization as presented herein may be applied to a wide variety of communication system application.

Considering memory depth of a communication link, the memory depth of a service flow is the product of the maximum latency allocated to the device (e.g., transmitter or receiver) based on the quality of service requirements of the service flow and the corresponding data rate of that transmission.

It is again noted here and elsewhere herein that a variety of operational parameters cooperatively define a memory depth of a signal to be transmitted via a communication link. In one embodiment, the memory depth corresponds to an "interleaver depth". However, the memory depth may not take the form of a true interleaver, but it is in actuality the "memory depth", which may be viewed as being in terms of bits (e.g., information bits) required by the latency and data rate of a communication link.

In actuality, the waveform and implementations may require more "bits" of storage, such as schemes with inner and outer coding because some additional parity bits may need to be stored in a receiver communication device. The calculation for a service flow of its PHY latency X data rate provides the amount of memory bits required by the combination of the transmitter and receiver to store the information for one service flow. It is noted that transmission delay through the communication medium is being considered as basically negligible here; alternatively, if the transmission delay is non-negligible compared to the PHY latency specified for a service flow, then the allocation for transmission delay should be subtracted from the PHY latency before computing the product for "memory depth."

Referring again to the example provided above using service A and service B:

Consider that service A flow has a memory depth of 10 Mbps×100 milliseconds=1 million bits.

Consider that service flow B has memory depth of 20 Mbps×10 milliseconds=200,000 bits.

For the communication link configured to provide 5 separate service flows of service flow type A, this provides 50 Mbps and requires 5 million bits of memory depth. For the communication link configured to provide 3 separate service flows of service flow B this provides 60 Mbps and requires 600,000 bits of memory depth.

In accordance with various aspects provided herein, a main concept is to recognize and limit the complexity or cost of the transmitter, the receiver, or both, in the system, by placing a limit on the total memory depth required, rather than letting other considerations be driving the possible variations for handling multiple service flows in the link irrespective of total memory depth.

In this example, assume a total memory depth "cap" of 2.2 million bits is levied (as an example). Therefore, the communication link could support up to 2 separate service flows of service flow A, and then assuming this is using 40% of the link capacity (⅖), this leaves ⅗ of the communication link available for other service flows. This communication link capacity allows addition of one service flow B.

The total memory depth for the combination is 2 million plus 200,000 bits, so this fits within the total cap on memory depth. If one service flow of service flow A is provided, then ⅘ of the communication link capacity remains, and two service flows of service flow B can be provided; the 1.4 million bits of interleaver depth also fit within the cap. However, due to the cap, 3 service flows of service flow A cannot be provided, since the 3 million bits of memory depth required exceed the cap. Even though the link capacity can accommodate the data rate, due to the memory cap, the 3 service flows of service flow A are not allowed.

Obviously, other examples can be constructed where combinations of service flows A and a service flows B are limited by interleaver depth cap, but permitted by link capacity, but where non-zero numbers of each service flow are permissible under both limits (both link capacity and total interleaver depth).

It is again noted that a different cap or limit of memory depth may exist for the transmitter than for the receiver. One such example would be where the transmitter and receiver can operate wherein the receiver does not have to process fully the entirety of data received via the communication link. An example might be where a receiver #1 is fed one service flow A, and a receiver #2 is fed two service flows A, and both receivers are fed one service flow B. The communication link total is ⅗+⅓ capacity which is less than or equal to one, so the communication link is within the total communication link capacity. Also, each receiver is operating under 2.2 million bits of memory depth, but the transmitter is operating at 3.2 million bits of memory depth.

In another embodiment, in DOCSIS 3.0, cable modems report their downstream capabilities to the cable modem termination system (CMTS) and presumably the CMTS complies and configures the downstream communications directed to the cable modem in conjunction with their reported capability. In a similar fashion, in an alternative embodiment, different receivers would have differing caps or limits on total memory depth, and these devices would report these limits or caps on memory depth to the transmitter. The transmitters would comply by configuring the communication links or portions of communication links directed to the receiver accordingly. In another embodiment, receivers may request additional services from the transmitter, and they may know their memory depth cap, and what they have already been provided, and limit their requests to be consistent with what they can accommodate. This may include some buffering requirements within the receiver device.

One goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and/or other types of media (or combinations thereof) as well.

Figure 2:
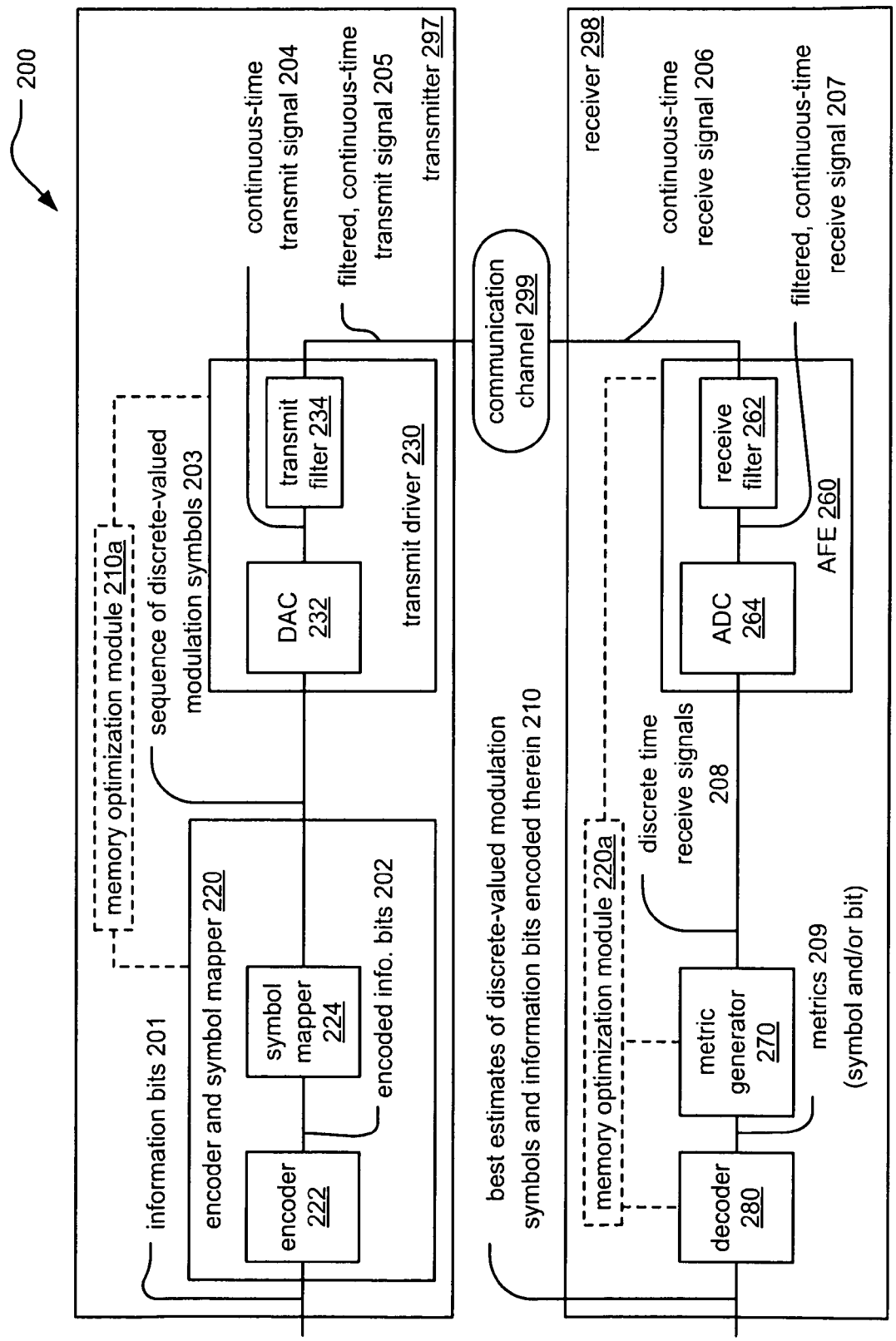
Figure 3:
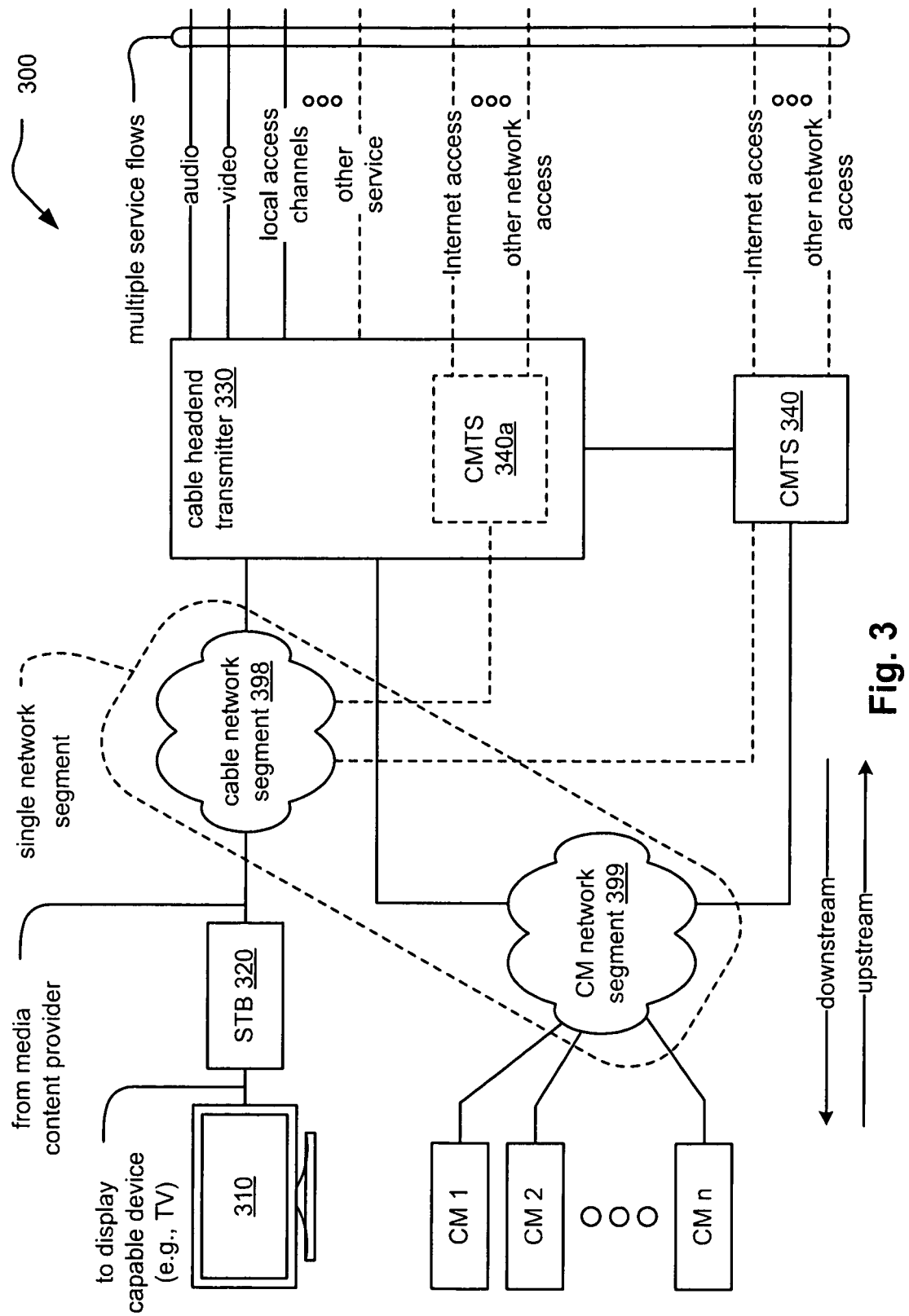

FIG. 1, FIG. 2, and FIG. 3 are diagrams which illustrate various embodiments of communication systems, 100, 200, and 300, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver.

There are several different types of media by which the communication channel 199 may be implemented (e.g., a wireless communication channel 140 using local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

The communication device 110 includes a memory optimization module 110a that is capable to perform functionality of at least one of the embodiments described herein. Also, the communication device 120 includes a memory optimization module 120a that is also capable to perform functionality of at least one of the embodiments described herein. Each of the modules 110a and 120a may operate independently within its respective communication device, or they may operate in cooperation with one another.

It is noted that while this embodiment of communication system 100 includes communication devices 110 and 120 that include both transmitter and receiver functionality, clearly, communication device 110 could include only transmitter functionality and communication device 120 could include only receiver functionality, or vice versa, to support uni-directional communication (vs. bi-directional communication) in alternative embodiments.

Any of a variety of types of coded signals (e.g., turbo coded signals, turbo trellis coded modulation (TTCM) coded signal, LDPC (Low Density Parity Check) coded signals, Reed-Solomon (RS) coded signal, and/or any combination of such coded signals, etc.) can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The transmitter 297 includes a memory optimization module 210a that is capable to perform functionality of at least one of the embodiments described herein. Also, the receiver 298 includes a memory optimization module 220a that is also capable to perform functionality of at least one of the embodiments described herein. Each of the modules 210a and 220a may operate independently within its respective communication device, or they may operate in cooperation with one another.

As can be seen within the transmitter 297, the memory optimization module 210a is coupled to a variety of modules therein. Analogously, within the receiver 298, the memory optimization module 220a is coupled to a variety of modules therein. Based on any of a variety of configuration parameters (e.g., user-selected, adaptively determined, based on a current operational mode, etc.) the memory optimization modules 210a and 220a operate to select and assist in the configuration of one or more operational parameters of each of the modules to which they are coupled.

As one example, depending on a selected memory depth to be employed by the encoder 222, the memory optimization module 210a operates to assist in the configuration of the encoder 222 (e.g., by selecting code rate, block size, code type, and/or any other parameter associated with determining the memory depth of the operation of the encoder 222). Analogously, the memory optimization module 220a of the receiver 297 then operates to assist in cooperation with the configuration of the encoder 222 to assist in cooperation with the configuration of the decoder 280, so that the decoder 280 can decode signals provided to it.

Clearly, other modules within each of the transmitter 297 and the receiver 298 are likewise configured in accordance with the memory optimization modules 210a and 220a.

Referring to the communication system 300 of FIG. 3, this communication system 300 may be viewed particularly as being a cable system. For example, the communication system 300 includes a number of cable modems (shown as CM 1, CM 2, and up to CM n). A cable modem network segment 399 couples the cable modems to a cable modem termination system (CMTS) (shown as 340 or 340a and as described below).

A CMTS 340 or 340a is a component that exchanges digital signals with cable modems on the cable modem network segment 399. Each of the cable modems coupled to the cable modem network segment 399, and a number of elements may be included within the cable modem network segment 399. For example, routers, splitters, couplers, relays, and amplifiers may be contained within the cable modem network segment 399.

The cable modem network segment 399 allows communicative coupling between a cable modem (e.g., a user) and the cable headend transmitter 330 and/or CMTS 340 or 340a. Again, in some embodiments, a CMTS 340a is in fact contained within a cable headend transmitter 330. In other embodiments, the CMTS is located externally with respect to the cable headend transmitter 330 (e.g., as shown by CMTS 340). For example, the CMTS 340 may be located externally to the cable headend transmitter 330. In alternative embodiments, a CMTS 340a may be located within the cable headend transmitter 330. The CMTS 340 or 340a may be located at a local office of a cable television company or at another location within a cable system. In the following description, a CMTS 340 is used for illustration; yet, the same functionality and capability as described for the CMTS 340 may equally apply to embodiments that alternatively employ the CMTS 340a. The cable headend transmitter 330 is able to provide a number of services including those of audio, video, local access channels, as well as any other service of cable systems. Each of these services may be provided to the one or more cable modems (e.g., CM 1, CM 2, etc.). In addition, it is noted that the cable headend transmitter 330 may provide any of these various cable services via cable network segment 398 to a set top box (STB) 320, which itself may be coupled to a television 310 (or other video or audio output device). While the STB 320 receives information/services from the cable headend transmitter 330, the STB 320 functionality may also support bi-directional communication, in that, the STB 320 may independently (or in response to a user's request) communicate back to the cable headend transmitter 330 and/or further upstream.

In addition, through the CMTS 340, the cable modems are able to transmit and receive data from the Internet and/or any other network (e.g., a wide area network (WAN), internal network, etc.) to which the CMTS 340 is communicatively coupled. The operation of a CMTS, at the cable-provider's head-end, may be viewed as providing analogous functions provided by a digital subscriber line access multiplexor (DSLAM) within a digital subscriber line (DSL) system. The CMTS 340 takes the traffic coming in from a group of customers on a single channel and routes it to an Internet Service Provider (ISP) for connection to the Internet, as shown via the Internet access. At the head-end, the cable providers will have, or lease space for a third-party ISP to have, servers for accounting and logging, dynamic host configuration protocol (DHCP) for assigning and administering the Internet protocol (IP) addresses of all the cable system's users (e.g., CM 1, CM2, etc.), and typically control servers for a protocol called Data Over Cable Service Interface Specification (DOCSIS), the major standard used by U.S. cable systems in providing Internet access to users. The servers may also be controlled for a protocol called European Data Over Cable Service Interface Specification (EuroDOCSIS), the major standard used by European cable systems in providing Internet access to users, without departing from the scope and spirit of the invention.

The downstream information flows to all of the connected cable modems (e.g., CM 1, CM2, etc.). The individual network connection, within the cable modem network segment 399, decides whether a particular block of data is intended for it or not. On the upstream side, information is sent from the cable modems to the CMTS 340; on this upstream transmission, the users within the group of cable modems to whom the data is not intended do not see that data at all. As an example of the capabilities provided by a CMTS, a CMTS will enable as many as 1,000 users to connect to the Internet through a single 6 Mega-Hertz channel. Since a single channel is capable of 30-40 Mega-bits per second of total throughput (e.g., currently in the DOCSIS standard, but with higher rates envisioned such as those sought after in accordance with the developing DVB-C2 (Digital Video Broadcasting—Second Generation Cable) standard, DVB-T2 (Digital Video Broadcasting—Second Generation Terrestrial) standard, etc.), this means that users may see far better performance than is available with standard dial-up modems.

Moreover, it is noted that the cable network segment 398 and the cable modem network segment 399 may actually be the very same network segment in certain embodiments. In other words, the cable network segment 398 and the cable modem network segment 399 need not be two separate network segments, but they may simply be one single network segment that provides connectivity to both STBs and/or cable modems. In addition, the CMTS 340 or 340a may also be coupled to the cable network segment 398, as the STB 320 may itself include cable modem functionality therein.

It is also noted that any one of the cable modems 1, 2, ... m n, the cable headend transmitter 330, the CMTS 340 or 340a, the television 310, the STB 320, and/or any device existent within the cable network segments 398 or 399, may include a memory optimization module as described herein to assist in the configuration of various modules and operation in accordance with any one of a plurality of protocols therein.

Figure 4:
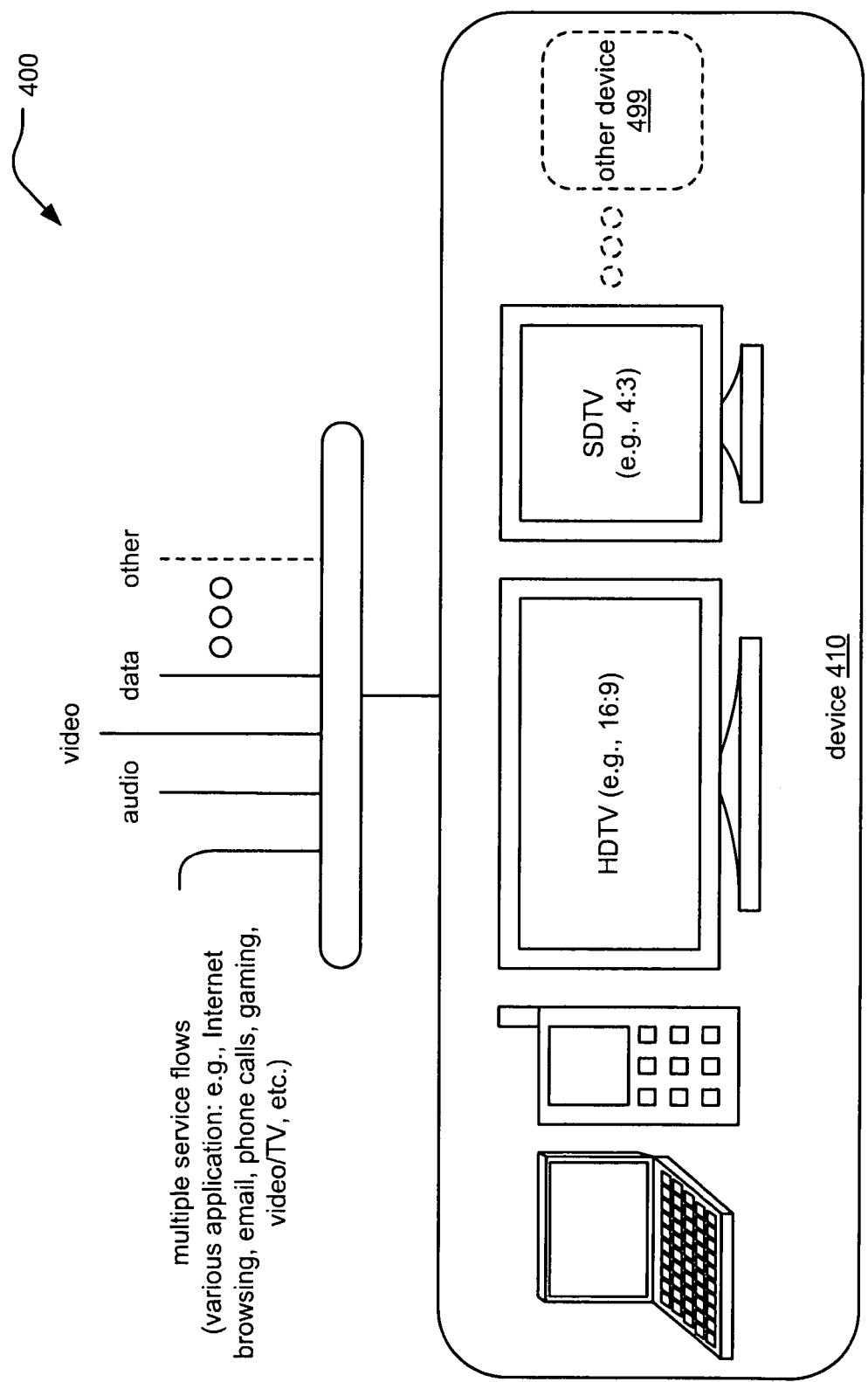
FIG. 4 illustrates an embodiment of a device receiving multiple service flows provided via one or more communication channels.

FIG. 4 illustrates an embodiment 400 of a device receiving multiple service flows provided via one or more communication channels. The device 410 depicted in this diagram can be any type of device (e.g., a laptop computer, a personal communication device such as a PDA, telephone, etc., a television such as a high definition TV (HDTV), or standard definition TV (SDTV), or any other types of device 499). In many modern system applications, there is an ever increasing desire to provide a number of service flows to a particular device. For example, a single device may include capability to receive a first service flow including an audio service flow such as a radio or Internet-streaming radio broadcast, a video service flow such as a television program, On-Demand type feature, a data service flow such as an email service or other data transfer service (e.g., Internet browsing, etc.). Moreover, gaming that involves multiple users coupled to one another via a network (e.g., the Internet) continues to grow in popularity. There are a variety of reasons and means by which multiple service flows may be provided to a particular device through one or more communication channels coupled to the device.

Figure 5:
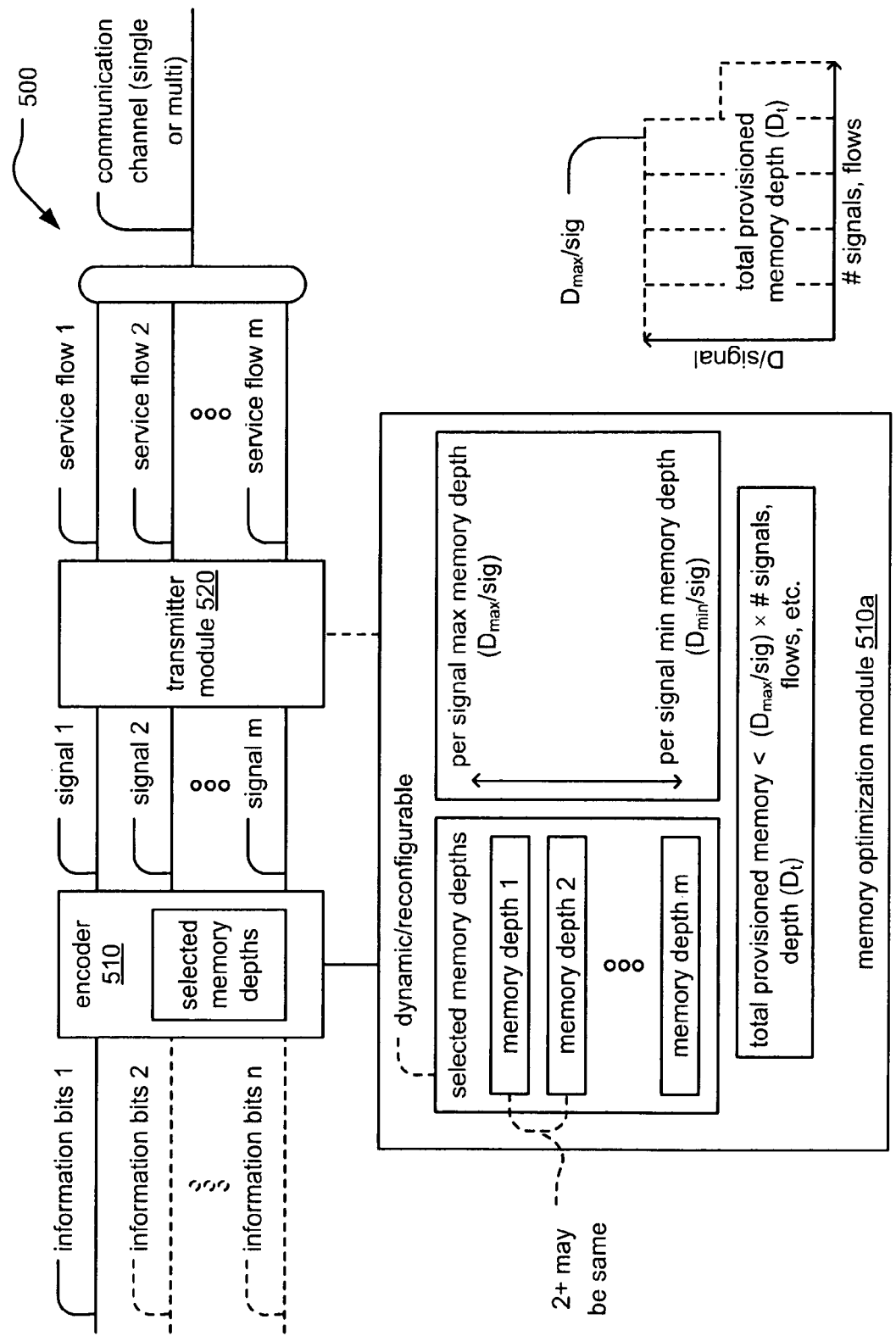
FIG. 5 illustrates an embodiment of an apparatus including a memory optimization module that assists in the configuration and operation of various other modules therein.

FIG. 5 illustrates an embodiment of an apparatus 500 including a memory optimization module that assists in the configuration and operation of various other modules therein. One or more groups of information bits are provided to an encoder 510 that is operative in accordance with any one of a number of different memory depths. The encoder 510 is operative to encode in accordance with any one of a number of memory depths thereby generating one or more signals.

A memory optimization module 510a is coupled to the encoder (or alternatively implemented within the encoder 510), that is operative to select a corresponding memory depth employed by the encoder for generating each signal. A transmitter module 520 is operative to transmit signals respectively via various service flows. It is noted that the various service flows can be transmitted via a common communication channel or alternatively via more than one communication channel. In some embodiments, a communication channel coupled to the transmitter module 520 includes multiple channels itself, and some of these channels may be bonded together and operate in cooperation with one another.

The memory optimization module 510a includes a number of various memory depths that may be selected to configure the encoder 510 for operation. It is also noted that the total amount of memory depth provisioned within the memory optimization module 510a is limited by a predetermined total memory depth that allows less than all of the signals encoded by the encoder 510 to be encoded in accordance with a maximum per signal memory depth. For example, considering the maximum memory depth that may be employed in generating any one signal, then the total provisioned memory depth within the memory optimization module 510a is less than the maximum memory depth per signal ($D_{max}$/sig) times the total number of signals. In other words, each of the signals cannot be generated using a maximum memory depth per signal. At least one (or possibly more) of the signals are generated using less than a maximum memory depth. For example, each signal generated by the encoder 520 has a corresponding and respective memory depth. This memory depth may be any value between a minimum per signal memory depth and a maximum per signal memory depth, inclusive. This range can be implemented as a continuum or alternatively as discrete steps corresponding to different operational modes.

On the lower right hand corner of the diagram, it can be seen that all of the signals as generated by such a device do not have the maximum memory depth per signal. In such an embodiment, all of the signals, except one, are shown as being able to be generated in accordance with a maximum memory depth per signal ($D_{max}$/sig).

In accordance with various embodiments presented herein, intelligent configuration and allocation of the existing and provisioned resource allows for a high level of performance of the device even in view of the limited (or capped) amount of resources that govern the memory depth employed for each of the various signals.

The selected memory depths may be dynamically redistributed for generation of the various signals to be transmitted via the various service flows, and more than one of the selected memory depths may be the same (i.e., two or more selected memory depths are the same and employed to generate their respective signals).

While this embodiment describes largely the configuration of the encoder 510 using the various memory depths, it is noted that other modules within the apparatus 500 may also be configured and operated in accordance with one or more selected memory depth.

Figure 6:
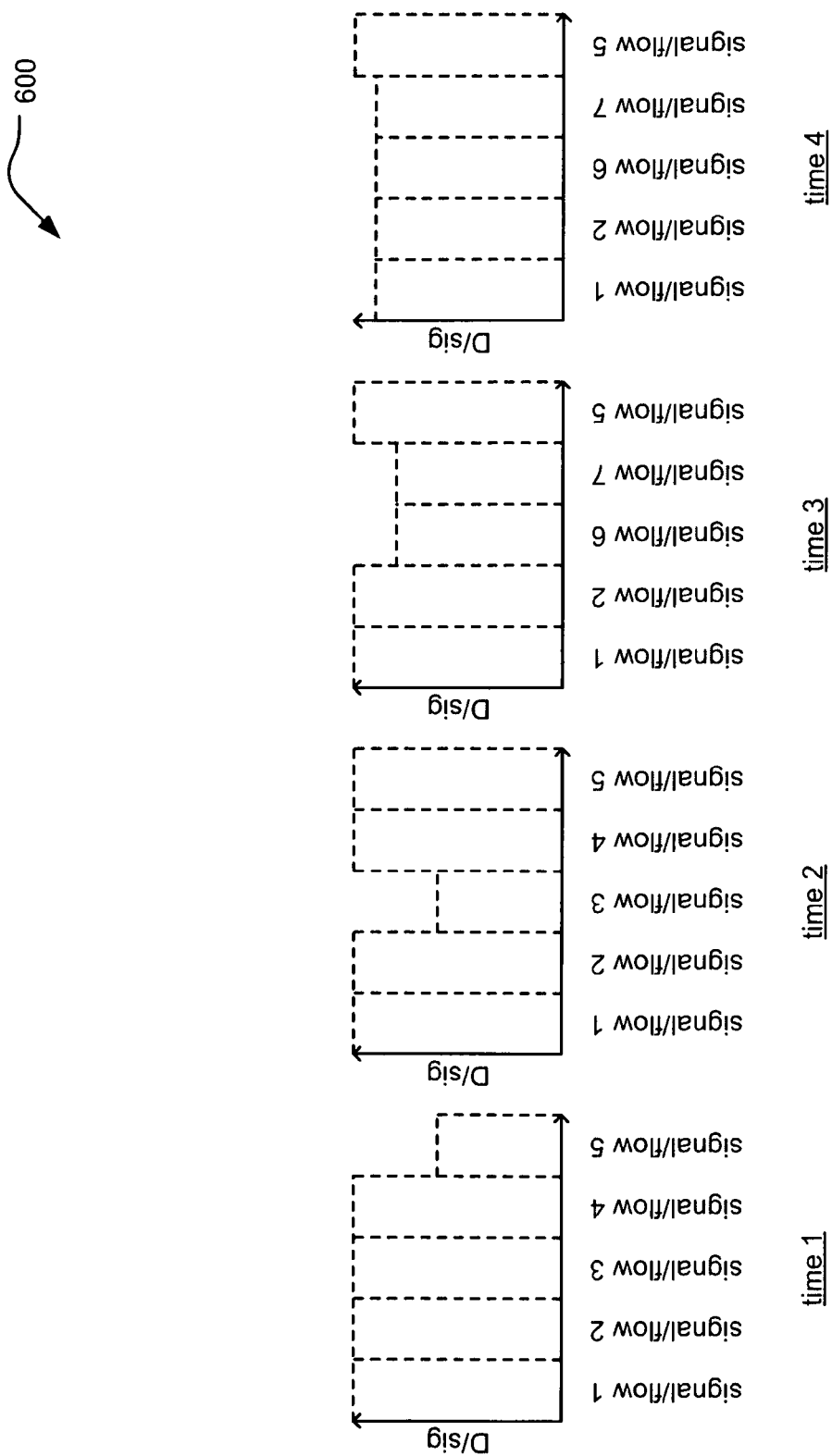
FIG. 6 illustrates an embodiment of dynamic allocation of memory depth resources across multiple signals and/or service flows as a function of time.

FIG. 6 illustrates an embodiment 600 of dynamic allocation of memory depth resources across multiple signals and/or service flows as a function of time. This embodiment 600 shows 5 separate signals and/or service flows that are operated in accordance with corresponding memory depths. Of course, more than 5 or fewer than 5 separate signals and/or service flows may alternatively be employed without departing from the scope and spirit of the invention.

During a first time (time 1), 4 of the signals and/or service flows (i.e., 1-4) operate in accordance with a maximum per signal memory depth. The fifth signal and/or service flow operates using a memory depth that is less than maximum.

During a second time (time 2), somewhat similarly to the time 1, again 4 of the signals and/or service flows operate in accordance with a maximum per signal memory depth, but this is now a different set of 4 (i.e., 1-2 and 4-5). The fifth signal and/or service flow (i.e., 3) operates using a memory depth that is less than maximum.

During a third time (time 3), signals and/or service flows 4 and 5 are no longer employed or needed. In their stead, signals and/or service flows 6 and 7 are added to the communication link. Then during the third time (time 3), signals and/or service flows (i.e., 1-2 and 5) operate in accordance with a maximum per signal memory depth. The two new separate signals and/or service flows (i.e., 6-7) operate using a memory depth that is less than maximum, and they each operate using only a slightly less than maximum memory depth. As can be seen comparing the operation at time 2 with time 3, the 2 new signals and/or service flows (i.e., 6-7) operate at time 3 using slightly larger memory depths than the signal and/or service flow 3 of time 2.

During a fourth time (time 4), 4 of the signals and/or service flows (i.e., 1-2 and 6-7) operate in accordance with a less than maximum per signal memory depth. Only one of the signals and/or service flows operates using a maximum per signal memory depth (i.e., 5). As can be seen comparing the operation at time 4 with time 3, the 4 signals and/or service flows (i.e., 1-2 and 6-7) operate at time 4 using slightly larger memory depths than the signals and/or service flows 6-7 of time 3.

This diagram shows how the total provisioned memory depth of a device may be re-allocated and re-distributed across the various signals and/or service flows at different times. As can be seen, each signal and/or service flow need not always operate at a maximum possible memory depth. Moreover, while the total memory depth employed in this embodiment is approximately the same for all of the different times, it need not always be so. For example, in some embodiments, none of the signals and/or service flows need operate at a maximum per signal memory depth; all of them may operate at a less than maximum per signal memory depth if desired.

The reader should appreciate that the service flows 1-5 at time 1 may be different than the service flows 1-5 at time 2 (or other times). By employing different memory depths, different service flows with their different respective data rates, error rates, and latency requirements may be supported effectively.

Figure 7:
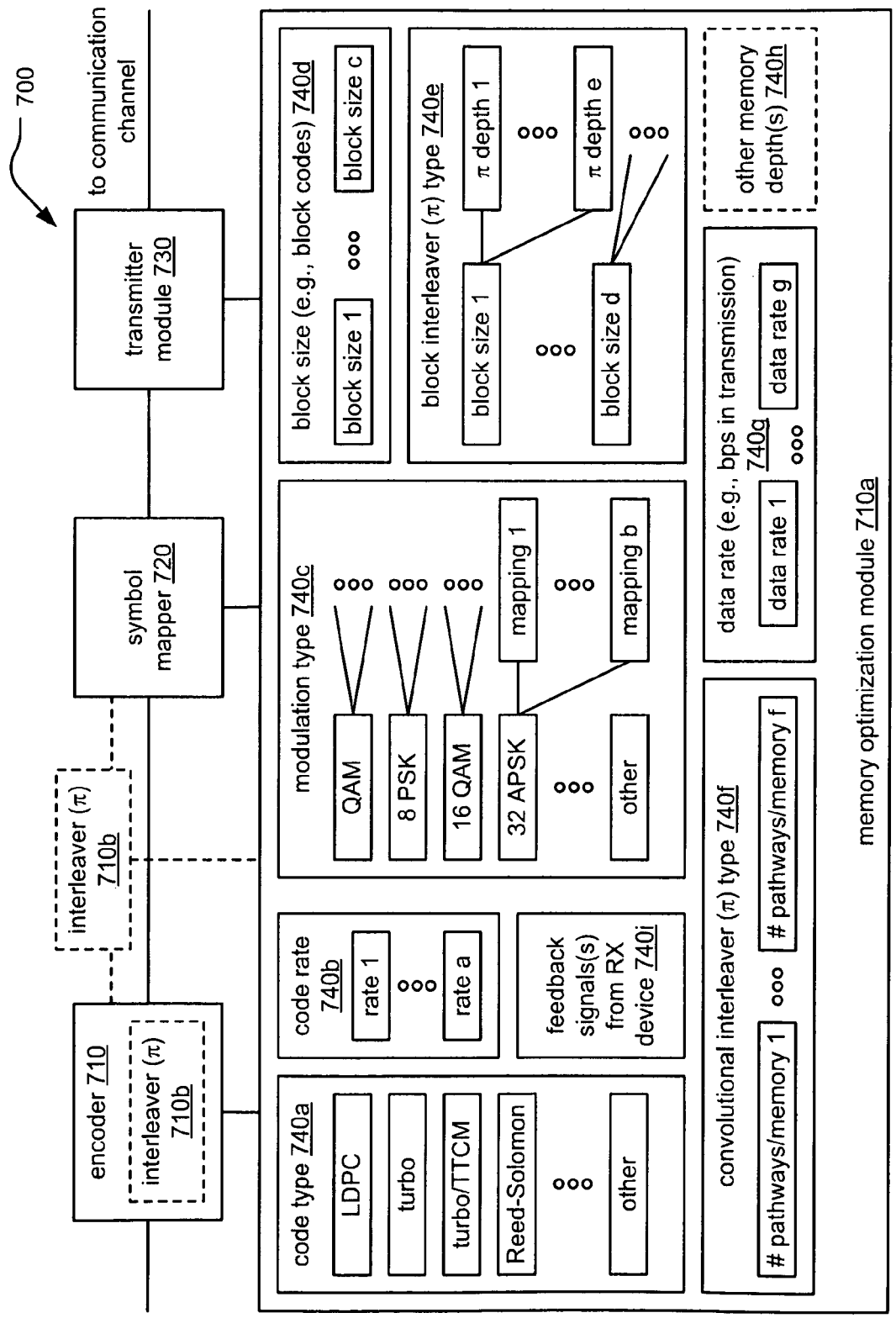
FIG. 7 illustrates another embodiment of an apparatus including a memory optimization module that assists in the configuration and operation of various other modules therein.

FIG. 7 illustrates another embodiment of an apparatus 700 including a memory optimization module that assists in the configuration and operation of various other modules therein. This embodiment shows a memory optimization module 710a coupled to and operating in cooperation with a number of separate modules within the apparatus 700. From one perspective, this apparatus 700 may be viewed as being a communication device located at one end of a communication channel that transmits a signal to another communication device located at another end of the communication channel.

Information bits are provided to an encoder 710 that generates encoded bits. In alternative embodiments, a plurality of encoders could be implemented instead of the encoder 710 such that each of the plurality of encoders performs encoding using a different error correction code (ECC) and/or operates using a different plurality of operational parameters (e.g., different code rates, block sizes, etc.). The encoder 710 may be a configurable encoder such that any operational parameter employed thereby may be adjusted (e.g., being viewed a variable code rate encoder, a variable block size encoder, a variable ECC type encoder, etc.). As a function of time and/or a function of different bits being encoded, the encoder 710 may employ different operational parameters in accordance with encoding.

From the encoder 710, these encoded bits may be arranged into labels or symbols for use in a symbol mapper 720. If desired, an interleaver 710b (which may be external to the encoder 710 or internal thereto) operates to interleave the information bits provided to the encoder 710 (in the internal embodiment) or interleave the encoded bits generated by the encoder 710. The bits (e.g., as arranged into symbols) undergo symbol mapping in the symbol mapper 720 using one or more modulation types (e.g., each modulation having a corresponding constellation and a mapping of the constellation points therein). A transmitter module 730 operates to process the mapped symbols (output of the symbol mapper) into a continuous time signal that comports with a communication channel (e.g., including any one or digital to analog conversion, gain adjustment, filtering, frequency conversion, etc.), and the signal is then launched into the communication channel.

The memory optimization module 710a is operative to select corresponding memory depths for one or up to all of the various modules within the apparatus 700. For example, the memory optimization module 710a is operative to select a memory depth for any one, any subset, or all of the encoder 710, the interleaver 710b, the symbol mapper 720, and the transmitter module 730.

It is noted that the memory depth of a particular signal may be viewed as corresponding to a variety of different parameters employed by any of the various modules used to generate that signal. For example, with reference to the encoder 710, different codes can inherently have different memory depths, and each of respective different types of codes may also be operated in accordance with different constraints and parameters thereby varying the memory depth thereof.

Considering an example of an LDPC code, with respect to LDPC codes, the longer the block length that an LDPC code can process thereby generating an LDPC codeword, then the deeper is the memory depth of that particular LDPC code. Conversely, the shorter the block length that an LDPC code can process thereby generating an LDPC codeword, then the less deep (i.e., more shallow) is the memory depth of that particular LDPC code.

In general, certain codes may also be viewed to have greater error correction code (ECC) capability (e.g., ability to correct for more errors) than other codes. Depending on the overall ECC power of a respective code, a memory depth may be associated therewith. There may be certain situations where one type of coding may be preferable to others. In one embodiment, the encoder 710 is a configurable type encoder able to switch between and among different types of ECCs (e.g., LDPC, turbo, turbo/TTCM, Reed-Solomon (RS), etc.). Even with respect to each type of ECC, the encoder 710 is a configurable type encoder able to switch between and among different operational parameters within a particular ECC (e.g., employ a first LDPC code of a first block length/code rate/etc., a second LDPC code of a second block length/code rate/etc., and so on). In other words, when considering memory depth of an encoder, there are a variety of parameters that together define the memory depth thereof.

Considering the memory optimization module 710a of this embodiment, the code type 740a, the code rate 740b, the block size (e.g., in the context of block codes such as LDPC codes) 740d are some of the operational parameters that would be operative to define the memory depth of the encoder 710 when generating encoded bits and/or a codeword.

With respect to the interleaver 710b of this embodiment, it too has corresponding operational parameters that govern its operation. The interleaver 710b in configurable to operate in accordance with any of these operational parameters. In an alternative embodiment (analogous as described above with respect to encoder 710), a plurality of interleavers could instead be implemented, and each interleaver operating in accordance with a particular set of operational parameters.

When the characteristics of a particular interleaving are desired, then that particular interleaver having those properties could be selected. In this embodiment, when a convolutional interleaving is employed by the interleaver 710b, then an operational parameter selected from convolutional interleaver type 740f is employed that determines the number of branches/pathways/rows in a convolutional interleaver and the number of memory/delays required. Alternatively, as can be seen, when a block interleaving is employed by the interleaver 710b, then an operational parameter selected from block interleaver type 740e is employed that determines the particular interleaver depth corresponding to a particular block size. For example, for a given block size, clearly more than one type of block interleaving may be employed (e.g., as shown by various interleaver depths corresponding to block size 1).

This principle of employing a configurable module (that may employ different operational parameters at any given moment) or employing a plurality of modules such that each of the modules operates in accordance with different operational parameters can be applied to any particular module within such a device. Moreover, even when employing a plurality of one type of modules, one or more of them may also be configurable as well.

With respect to the symbol mapper 720 of this embodiment, it too has corresponding operational parameters that govern its operation. Based on a memory depth as defined by a modulation type 740c, a given symbol is symbol mapped to a particular constellation having a mapping of the constellation points therein. In addition, each constellation shape may have more than one mapping of the constellation points therein as well (e.g., as shown by various mappings corresponding to constellation shape 32 APSK).

With respect to the transmitter module 730 of this embodiment, it too has corresponding operational parameters that govern its operation. The transmitter module may be able to support various data rates (e.g., as defined in terms of bits per second (bps)) 740g.

Generally speaking, any other memory depth 740h, as corresponding to any one or more of the operational parameters that govern operation of a particular module within the apparatus 700 may be used to define a memory depth associated with a signal. Adjusting any one operational parameter employed by any one of the modules within the apparatus 700 modifies the overall memory depth associated with a signal.

Therefore, in certain embodiments, memory depth of a particular signal may be viewed as being a multi-dimensional parameter (e.g., adjusting various operational parameters employed more than one of the modules within the apparatus 700). Alternatively, the granularity of adjusting memory depth can be reduced to adjusting only one operational parameter employed by only one of the modules within the apparatus 700 thereby reducing the memory depth to being a uni-dimensional parameter. Moreover, the memory optimization module 710a can switch between operating and adjusting memory depth as a uni-dimensional parameter at a first time, and then adjusting memory depth as a multi-dimensional parameter at a second time.

Moreover, the memory depth as defined by the memory optimization module 710a may also consider one or more feedback signals received from a receiver device 740i coupled to the apparatus 700. For example, any of a variety of considerations may be employed by the memory optimization module 710a, including operational conditions of a communication channel to which the apparatus 700 is coupled, information provided by a receiver device 740i coupled to the apparatus 700 via a communication channel (e.g., regarding its operational state, conditions, etc.), and/or any other consideration.

Figure 8:
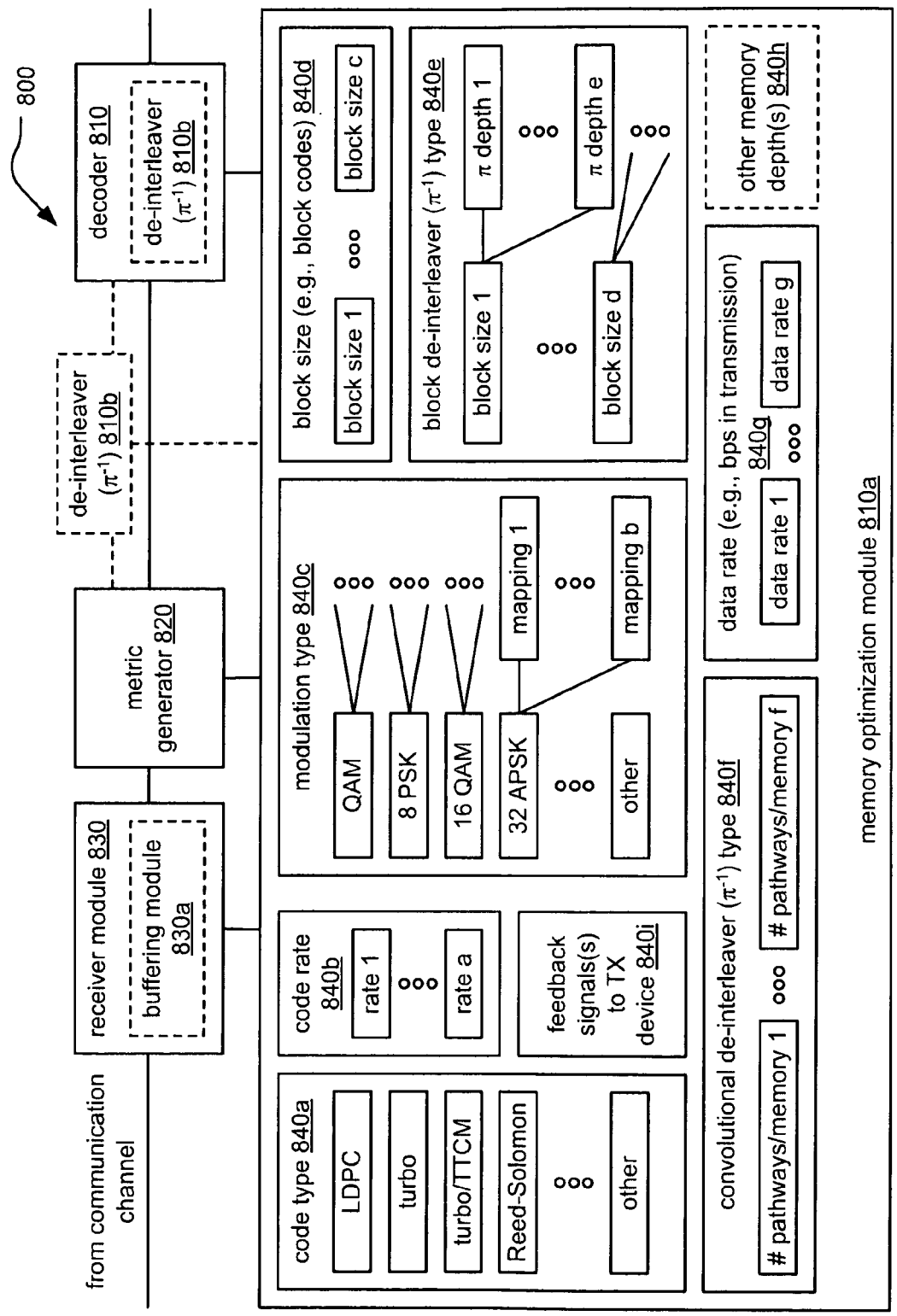
FIG. 8 illustrates another embodiment of an apparatus including a memory optimization module that assists in the configuration and operation of various other modules therein.

FIG. 8 illustrates another embodiment of an apparatus 800 including a memory optimization module that assists in the configuration and operation of various other modules therein.

It is noted that the embodiment corresponding to FIG. 7 depicts a memory optimization module 710a operating in accordance with a device that generates one or more signals to be transmitted via one or more communication channels. The embodiment corresponding to FIG. 8 instead depicts a memory optimization module 810a operating in accordance with a device that received one or more signals that have been transmitted via one or more communication channels.

The apparatus 800 includes a receiver module 830 that performs any necessary front end processing of a signal received from a communication channel (e.g., including any one or analog to digital conversion, gain adjustment, filtering, frequency conversion, etc.) to generate a digital signal provided to a metric generator 820 that generates a plurality of metrics corresponding to a particular bit or symbol extracted from the received signal.

The metrics are then provided to a decoder 810 that processes the metrics to make estimates of information bits encoded within the received signal. In some embodiments a de-interleaver 810*b* (implemented either between the metric generator 820 or integrated within the decoder 810) operates complementarily with an interleaver implemented within at least one additional apparatus that generates the signal that eventually is received by the apparatus 800.

In one embodiment, the memory optimization module 810*a* itself operates complementarily with a memory optimization module 810*a* within such at least one additional apparatus that generates the signal that eventually is received by the apparatus 800. For example, the memory optimization module 810*a* is employed to select and configure various operational parameters such as code type 840*a*, code rate 840*b*, modulation type 840*c*, block size 840*d*, block de-interleaver type 840*e*, convolutional de-interleaver type 840*f*, data rate 840*g*, and/or any other memory depth related parameter 840*h*.

However, it is noted that complementary operation of the memory optimization module 810*a* does not necessarily indicate exact parameter configuration for all modules within the apparatus 800 as within at least one additional apparatus that generates the signal that eventually is received by the apparatus 800. For example, the apparatus 800 may include one or more operational parameters set slightly differently than within at least one additional apparatus that generates the signal that eventually is received by the apparatus 800. As one example, the apparatus 800 may be undergoing relatively significant processing to correct for errors within a signal, and a buffering module 830*a* (such as may be implemented within the receiver module 830) may operate to buffer and store a received signal so as to allow some extra time to resolve and correct for those errors. Also, the apparatus 800 may then send a signal to at least one additional apparatus that generates the signal that eventually is received by the apparatus 800 to request a modification of the data rate transmitted thereby. As such, it can be seen that the apparatus 800 may operate differently and be configured differently than at least one additional apparatus that generates the signal that eventually is received by the apparatus 800.

Also, the memory depth as defined by the memory optimization module 810*a* may also consider one or more feedback signals received from a transmitter device 840*i* coupled to the apparatus 800. For example, any of a variety of considerations may be employed by the memory optimization module 810*a*, including operational conditions of a communication channel to which the apparatus 800 is coupled, information provided by a transmitter device 840*i* coupled to the apparatus 800 via a communication channel (e.g., regarding its operational state, conditions, etc.), and/or any other consideration.

As analogous with a previous embodiment, the memory depth as defined by the memory optimization module 810*a* may be viewed as being a multi-dimensional parameter (e.g., adjusting various operational parameters employed more than one of the modules within the apparatus 800). Alternatively, the granularity of adjusting memory depth can be reduced to adjusting only one operational parameter employed by only one of the modules within the apparatus 800 thereby reducing the memory depth to being a uni-dimensional parameter. Moreover, the memory optimization module 810*a* can switch between operating and adjusting memory depth as a uni-dimensional parameter at a first time, and then adjusting memory depth as a multi-dimensional parameter at a second time.

Figure 9:
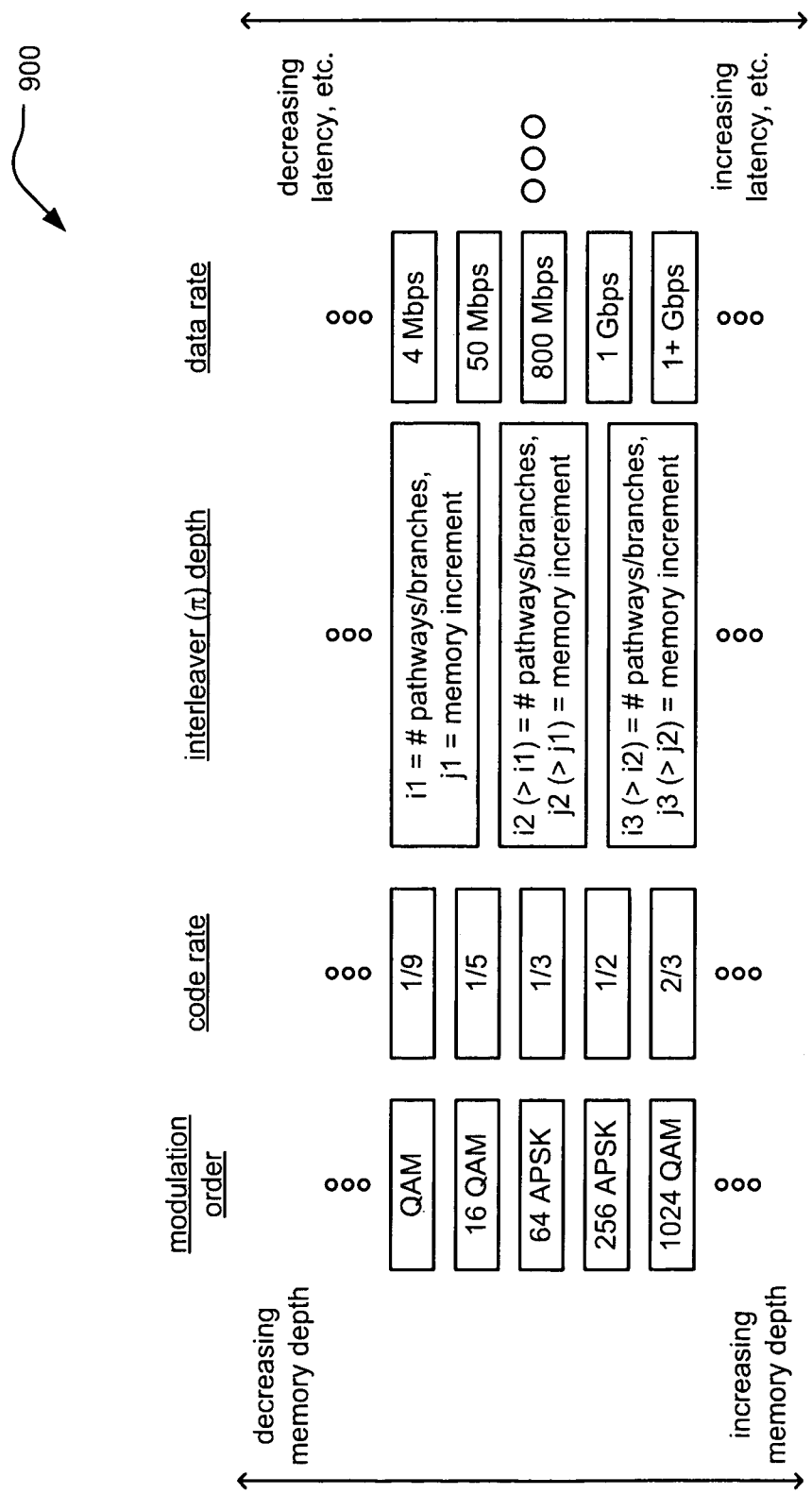
FIG. 9 illustrates an embodiment of various operational parameters and their correspondence to increasing and decreasing memory depths.

FIG. 9 illustrates an embodiment 900 of various operational parameters and their correspondence to increasing and decreasing memory depths. This diagram shows how the adjustment of certain parameters that govern various modules within a communication device adjust and affect memory depth of a corresponding signal.

Considering the example of modulation order, as the number of constellation points (e.g., complexity) of a modulation increases (e.g., QAM having 4 constellation points, 16 QAM having 16 constellation points, and so on), so does the memory depth of the modulation type increase. It follows that it will typically take longer to calculate the various metrics associated with a symbol having a relatively higher order modulation type than to calculate the various metrics associated a symbol having a relatively lower order modulation type (e.g., 4 metrics associated with a QAM symbol vs. 16 metrics associated with a 16 QAM symbol).

Considering the example of code rate, as the code rate decreases (e.g., decreased code rate meaning more redundancy/parity bits available for error correction at the expense of less information bit throughput), so does the memory depth of the code rate decrease. Also, considering the example of interleaver depth (in the context of convolutional interleaving), as the interleaver depth increases, so does the memory depth of the interleaver depth increase. As an example, a first interleaver depth that corresponds to a first set of pathways/branches and memory that is larger and deeper than a second interleaver depth that corresponds to a second set of pathways/branches and memory will consequently have a deeper memory depth. Considering another example, as the date rate continues to increase, so too will the memory depth associated therewith increase.

As can be seen, as memory depth increases, so typically will the latency associated with processing a corresponding signal. For example, signals having relatively higher order modulation, relatively higher code rate, etc. will generally incur more latency than signals having relatively lower order modulation, relatively lower code rate, etc. As a concrete example, there is generally more latency associated with processing and decoding a high definition (HD) television signal as compared to processing and decoding a standard definition (SD) television signal.

Figure 10:
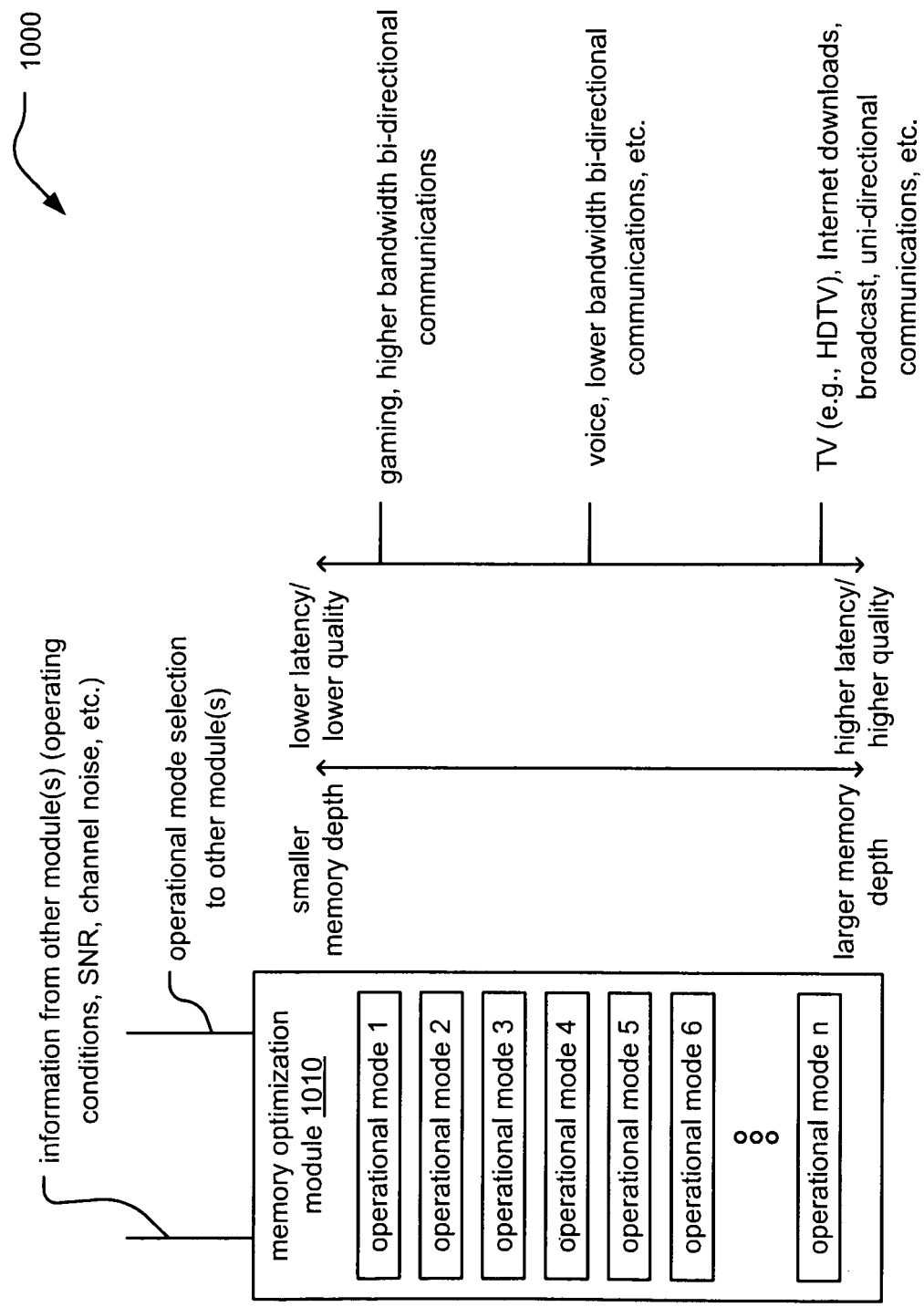
FIG. 10 illustrates an embodiment of various operational modes as may be supported in accordance with a memory optimization module to service various types of communications and applications.

FIG. 10 illustrates an embodiment 1000 of various operational modes as may be supported in accordance with a memory optimization module to service various types of communications and applications. It is noted that among the various service flows that may be supported by a device, they all may have different constraints and requirements in terms of latency.

As an example, gaming applications (e.g., such as those involving multiple users coupled to one another via the Internet) may be more willing to accept noise and errors than latency. Such communications are inherently bi-directional in nature and include the cooperation of multiple individuals. As may be understood by the reader, when playing a game interactively with more than one user, a slight reduction in image resolution (if acceptably short duration in time) may be tolerable if the latency is kept minimal to allow real time interaction between players of the game. However, as may also be understood, an undesirably long latency in the gaming context may simply make playing the game untenable.

As another example, certain television broadcast applications (e.g., most being uni-directional in nature) may be willing to accept relatively long latency rather than accept any noise within the signal. Considering an example of a subscriber ordering a high definition (HD) program, the user generally will expect a very high quality video program (e.g., in terms of clarity, resolution, etc.), and generally will be willing to tolerate a relatively long latency.

As yet another example that is more of a middle ground where a compromise of latency and quality may be more appropriate, consider voice communications in which both latency and quality may have equal and/or somewhat comparable importance. Such voice communications are generally much smaller bandwidth than those of HD broadcast programming, and as such, a compromise between quality and latency may be appropriate.

This embodiment 1000 shows a memory optimization module 1010 that is operative to select any one of a number of operational modes to meet and operate in accordance with the desired operation to meet various performance criterion/criteria within various applications.

Within this embodiment 1000, the operational modes 1 and 2 may be appropriately selected to configure various modules within a device operating in a gaming application (e.g., where a lower quality will be tolerated so long as latency is kept at a minimum). Alternatively, within this embodiment 1000, the operational modes n and n−1 may be appropriately selected to configure various modules within a device operating in a HD television application (e.g., where a higher quality is desired at an expense of an increased latency). Also, within this embodiment 1000, the operational modes 4 and 5 may be appropriately selected to configure various modules within a device operating in a voice application (e.g., where a compromise between an acceptable quality and an acceptable latency is made).

It is noted that each operational mode, as provided from the memory optimization module 1010, may include any one or multiple operational parameter settings to configure any one or multiple modules within a device. Moreover, it is noted that the operational mode as selected by the memory optimization module 1010 may be not only selected based on the application type or service flow type being serviced by a device (e.g., gaming vs. HDTV, etc.), but also other information from other modules within the device (e.g., indicating operating conditions, SNR, channel noise, environmental conditions [such as temperature, humidity, etc.] and/or any other information).

Figure 11:
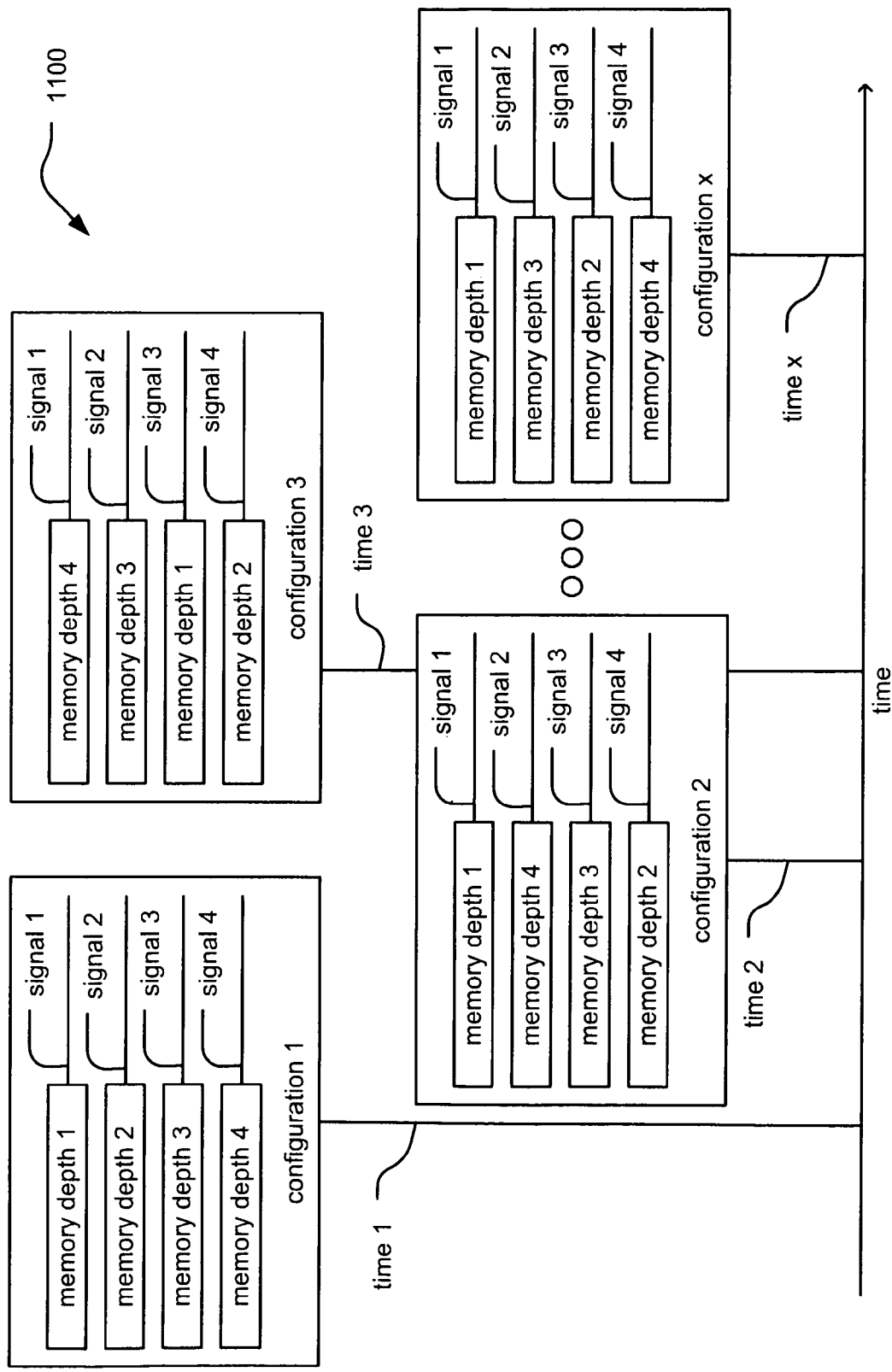
FIG. 11 illustrates an embodiment of dynamic re-allocation of various memory depth settings to service various signals and/or service flows as a function of time.

FIG. 11 illustrates an embodiment 1100 of dynamic re-allocation of various memory depth settings to service various signals and/or service flows as a function of time. This diagram shows how 4 corresponding memory depths are allocated to the generation of 4 respective signals. Of course, more or less than 4 signals may be employed in an alternative embodiment without departing from the scope and spirit of the invention, but 4 are employed for illustration in this embodiment 1100.

This embodiment 1100 shows how various memory depths are re-distributed and re-allocated to the generation of the 4 signals. For example, in a configuration 1 shown as occurring at a time 1, memory depth 1 is employed to generate signal 1, memory depth 2 is employed to generate signal 2, memory depth 3 is employed to generate signal 3, and memory depth 4 is employed to generate signal 4.

Then, in a configuration 2 shown as occurring at a time 2, memory depth 1 is employed to generate signal 1, memory depth 4 is employed to generate signal 2, memory depth 3 is employed to generate signal 3, and memory depth 2 is employed to generate signal 4. Then, in a configuration 3 shown as occurring at a time 3, memory depth 4 is employed to generate signal 1, memory depth 3 is employed to generate signal 2, memory depth 1 is employed to generate signal 3, and memory depth 2 is employed to generate signal 4.

The dynamic re-distribution and re-allocation of the memory depths to generate various signals is performed until in a configuration x shown as occurring at a time x, memory depth 1 is employed to generate signal 1, memory depth 3 is employed to generate signal 2, memory depth 2 is employed to generate signal 3, and memory depth 4 is employed to generate signal 4.

This embodiment 1100 shows how various memory depths are switched and moved around so that as a function of time, different configurations of various modules allow for adaptive response to various conditions. As can also be seen with respect to this embodiment, the total amount of provisioned memory is the same in all of these various configurations. In other words, a finite and fixed amount of total memory depth is re-allocated and re-distributed among to direct the generation of the various signals.

FIG. 12, FIG. 13, FIG. 14, and FIG. 15 illustrate various embodiments of methods for operating a device in accordance with memory depth optimization.

Figure 12:
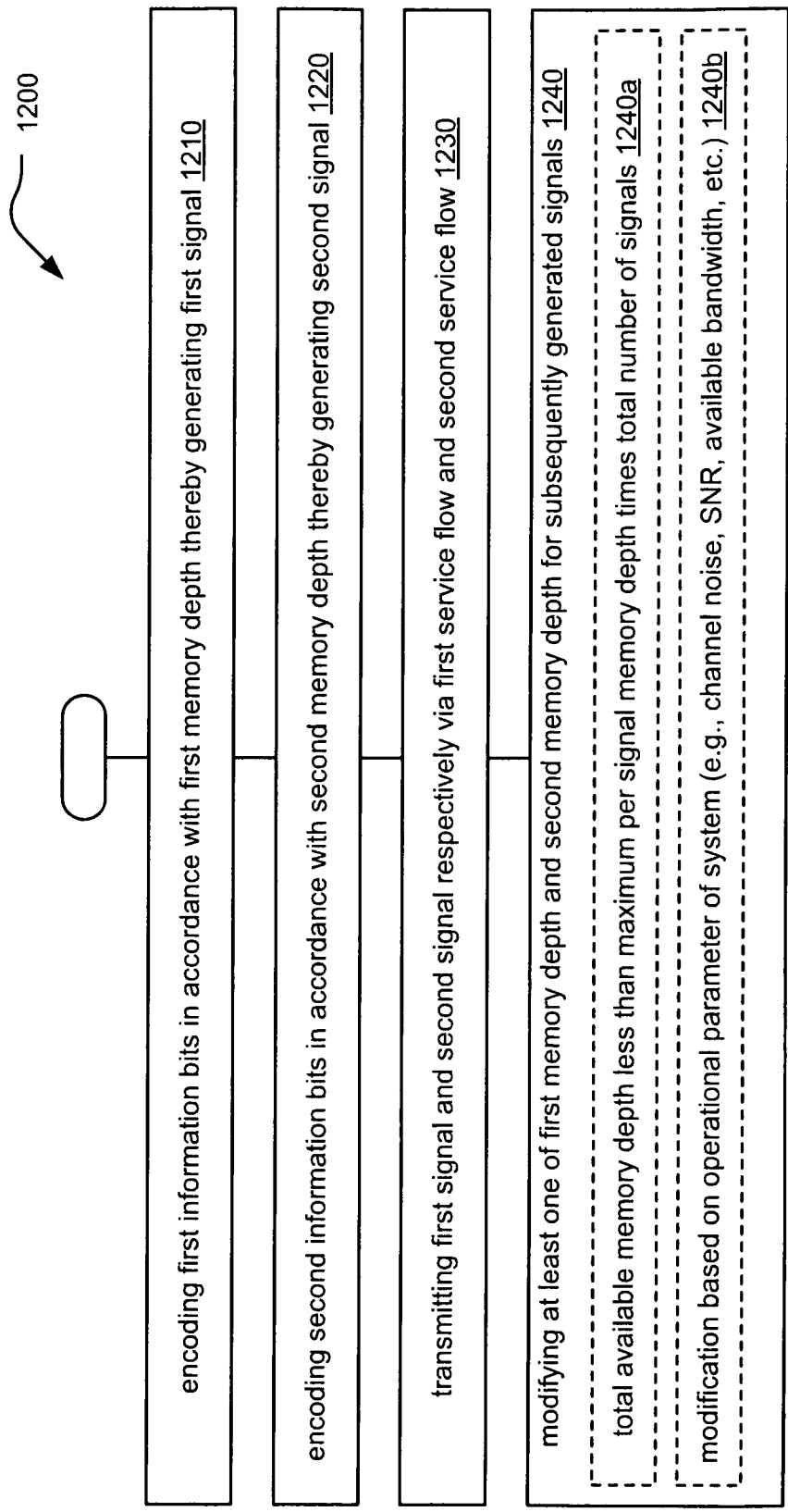
FIG. 12, FIG. 13, FIG. 14, and FIG. 15 illustrate various embodiments of methods for operating a device in accordance with memory depth optimization.

Referring to the method 1200 of FIG. 12, the method 1200 begins by encoding first information bits in accordance with first memory depth thereby generating first signal, as shown in a block 1210. The method 1200 then continues by encoding second information bits in accordance with second memory depth thereby generating second signal, as shown in a block 1220. The method 1200 then continues by transmitting first signal and second signal respectively via first service flow and second service flow, as shown in a block 1230. The method 1200 then continues by modifying at least one of first memory depth and second memory depth for subsequently generated signals, as shown in a block 1240.

In some embodiments, the block 1240 operates under the constraint that the total available memory depth (e.g., provisioned memory depth resources) is less than a maximum per signal memory depth times a total number of signals that may be generated, as shown in a block 1240a. Also, it is noted that modification of either of the first memory depth and the second memory depth may be made based on any operational parameter of a system performing the method 1200, as shown in a block 1240b. Some examples of such operational parameters include, though certainly are not limited to, channel noise, SNR, available bandwidth, etc.

Figure 13:
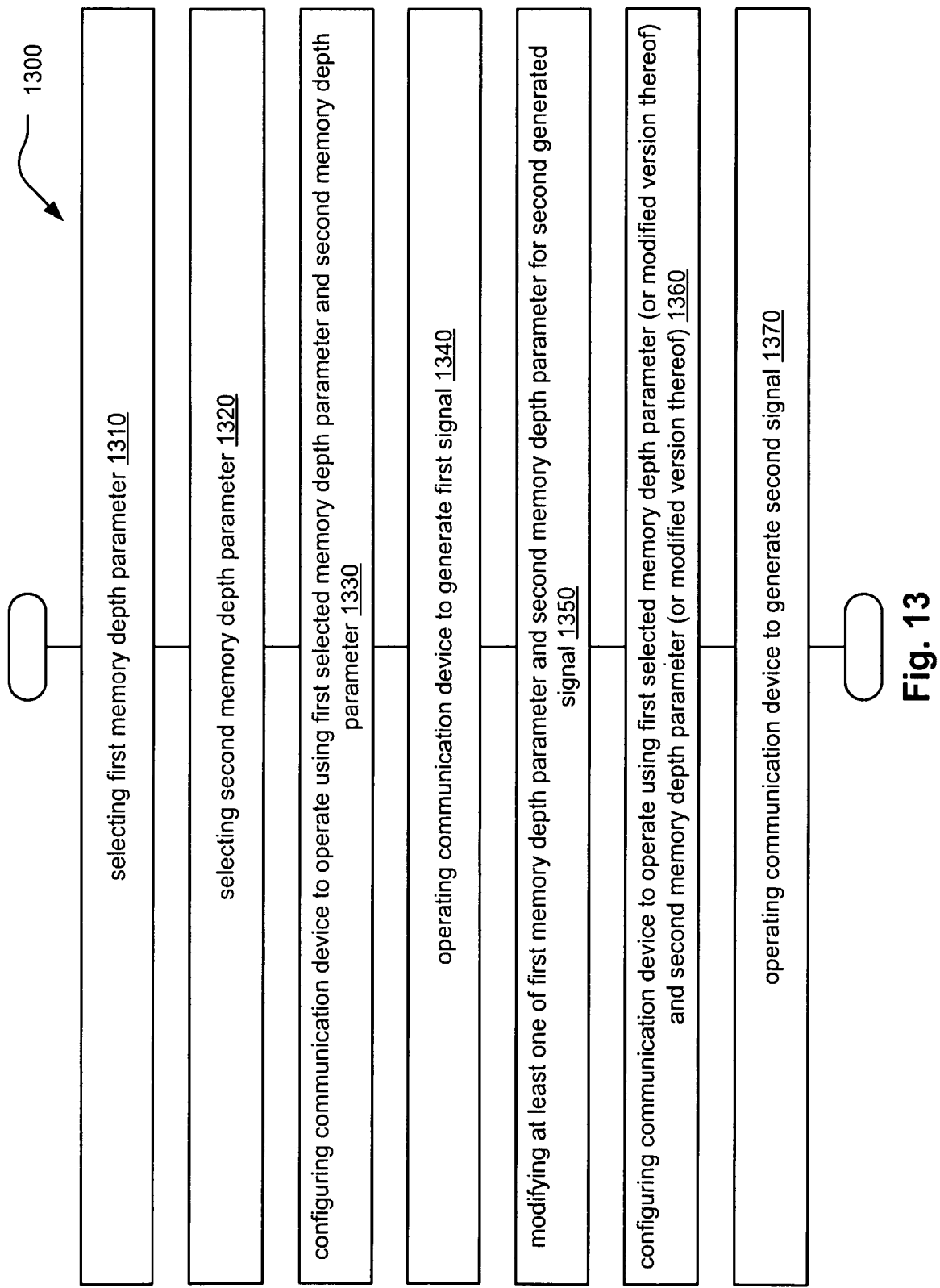

Referring to the method 1300 of FIG. 13, the method 1300 begins selecting first memory depth parameter, as shown in a block 1310. The method 1300 then continues by selecting second memory depth parameter, as shown in a block 1320. The method 1300 then continues by configuring communication device to operate using first selected memory depth parameter and second memory depth parameter, as shown in a block 1330. The method 1300 then continues by operating communication device to generate first signal, as shown in a block 1340. The method 1300 then continues by modifying at least one of first memory depth parameter and second memory depth parameter for second generated signal, as shown in a block 1350. The method 1300 then continues by configuring communication device to operate using first selected memory depth parameter (or modified version thereof) and second memory depth parameter (or modified version thereof), as shown in a block 1360. The method 1300 then continues by operating communication device to generate second signal, as shown in a block 1370.

Figure 14:
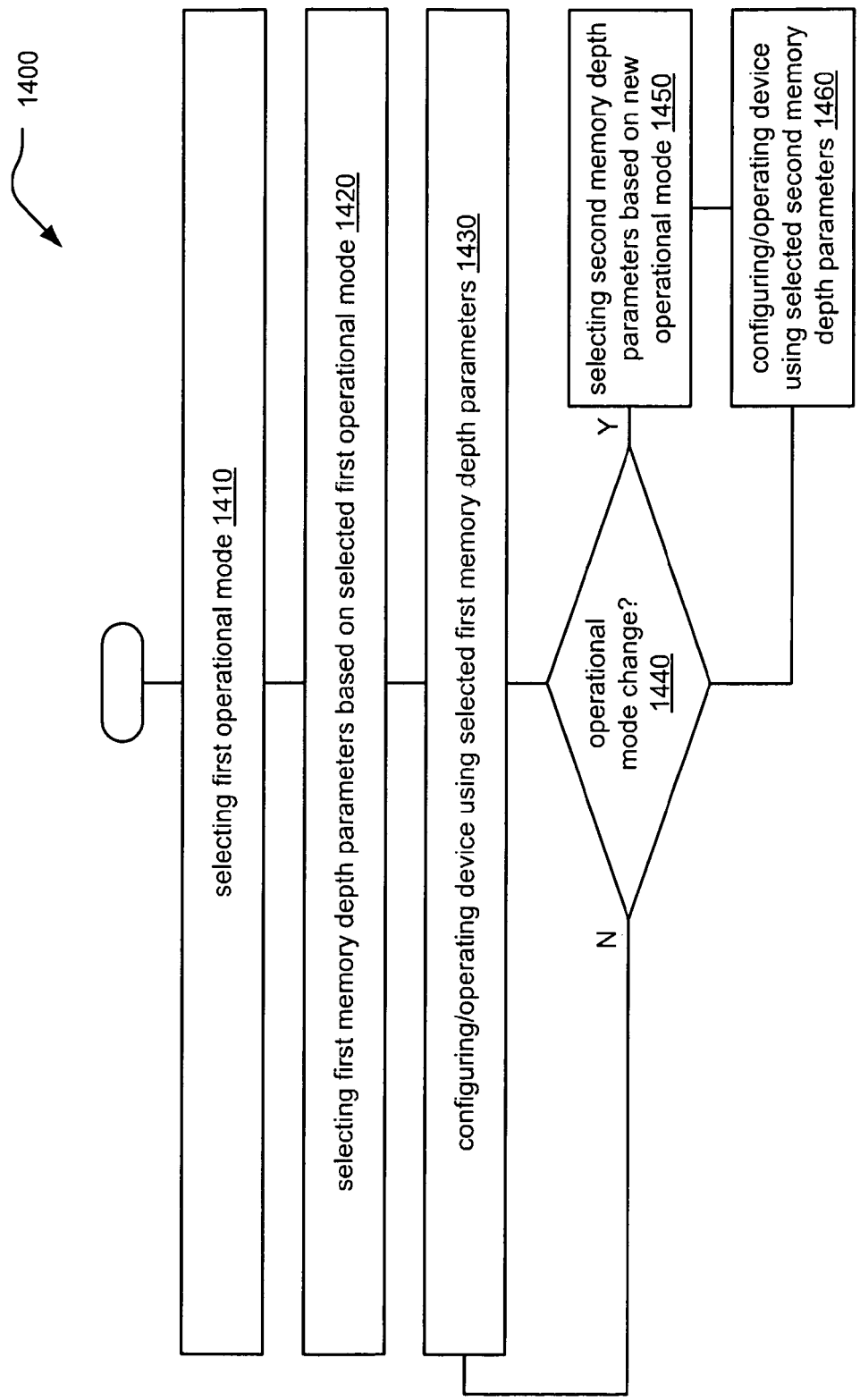

Referring to the method 1400 of FIG. 14, the method 1400 begins selecting first operational mode, as shown in a block 1410. The method 1400 then continues by selecting first memory depth parameters based on selected first operational mode, as shown in a block 1420. The method 1400 then continues by configuring/operating device using selected first memory depth parameters, as shown in a block 1430. The method 1400 then continues by determining whether or not an operational mode has changed, as shown in a block 1440.

If no operational mode change has been made, then the method 1400 continues to operate in accordance with block 1430. Alternatively, if an operational mode change has been made, then the method 1400 continues by selecting second memory depth parameters based on new operational mode, as shown in a block 1450. The method 1400 then continues by configuring/operating device using selected second memory depth parameters, as shown in a block 1460.

Figure 15:
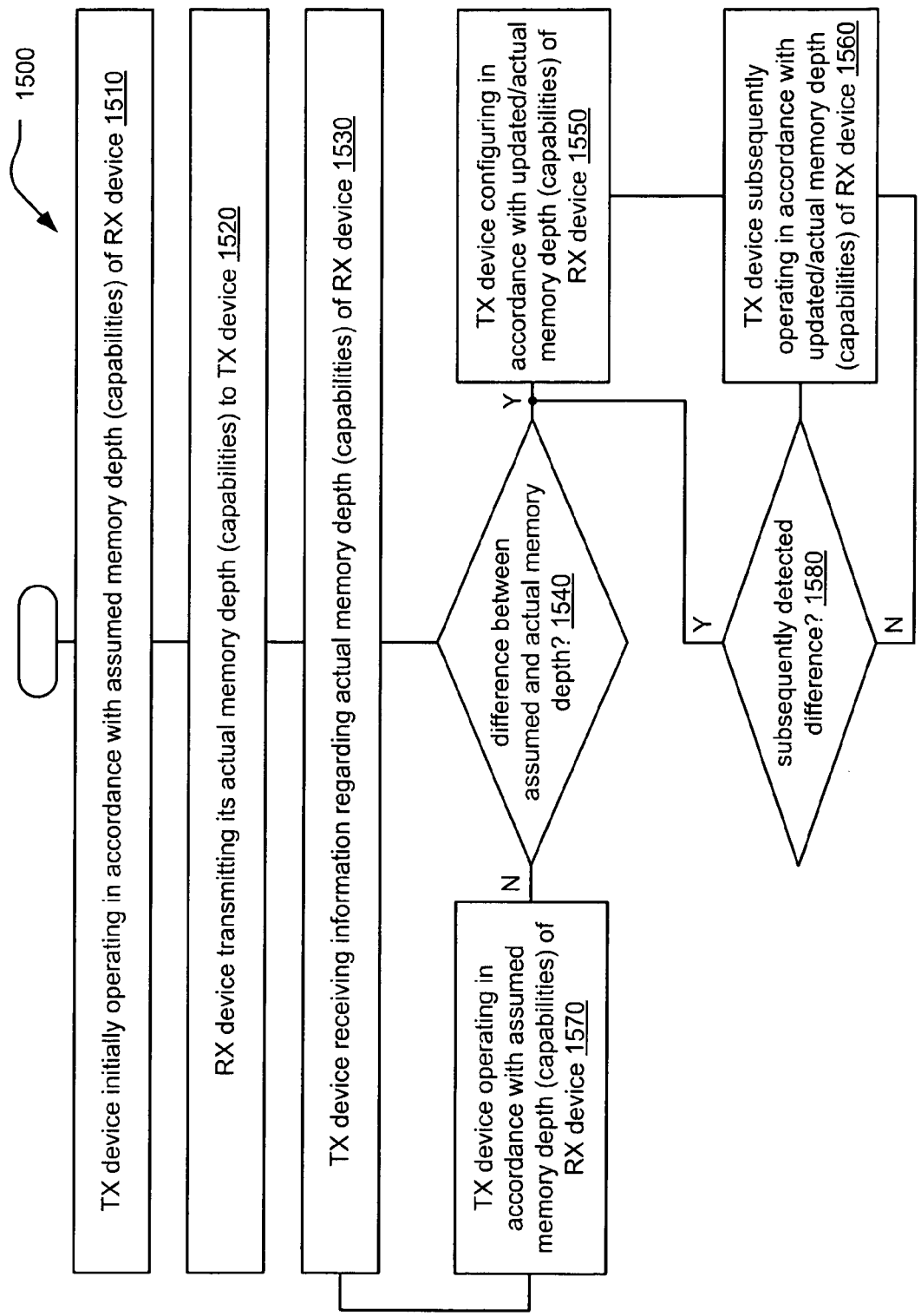

Referring to the method 1500 of FIG. 15, the method 1500 begins operating by operating a transmitter communication device initially in accordance with an assumed memory depth (capabilities) of a receiver communication device, as shown in a block 1510. This may be viewed as operating in accordance with a predetermined memory depth (capabilities) and/or a most robust/least complex/minimal memory depth (capabilities). For example, in the context of a communication device that is compliant with some communications standard/protocol, there will generally be 'a priori' knowledge regarding at least the minimal memory depth (capabilities) of the compliant communication device. For example, in this embodiment, the transmitter communication device may initially operate based on the assumption that, if the receiver communication device is a compliant communication device, it has a predetermined or known minimal memory depth (capabilities).

Sometime after (perhaps based on a request made by the transmitter communication device, or perhaps unilaterally as initiated by the receiver device), the receiver communication device operates by transmitting its actual memory depth (capabilities) to the transmitter device, as shown in a block 1520. The transmitter device then operates by receiving information regarding the actual memory depth (capabilities) of the receiver device, as shown in a block 1530.

Thereafter, it is determined whether or not there is a difference between the assumed memory depth (capabilities) of the receiver communication device by which the transmitter communication device is operating and the actual memory depth (capabilities) of the receiver communication device, as shown in a decision block 1540. If these two are the same (i.e., actual memory depth (capabilities) same as assumed memory depth (capabilities)), then the transmitter device continues by operating in accordance with the assumed memory depth (capabilities), as shown in a block 1570.

Alternatively, if there is a difference between the actual memory depth (capabilities) and the assumed memory depth (capabilities), then the transmitter communication device operates by configuring itself in accordance with the actual memory depth (capabilities) and subsequently operating in accordance with them, as shown in blocks 1550 and 1560.

If subsequently differences are detected between the memory depth (capabilities) by which the transmitter communication device is operating and a new/updated memory depth (capabilities) as provided by the receiver communication device (decision block 1580), then the transmitter communication device may again operate by configuring itself in accordance with the newly updated/actual memory depth (capabilities) and subsequently operating in accordance with them. In other words, each of the transmitter communication device and the receiver communication device is configurable as a function of time. In the event that the receiver communication device changes the configuration of its memory depth (capabilities), then the receiver communication device may communicate this to the transmitter communication device, and the communication device may again re-configure itself in accordance with that new information.

Figure 16:
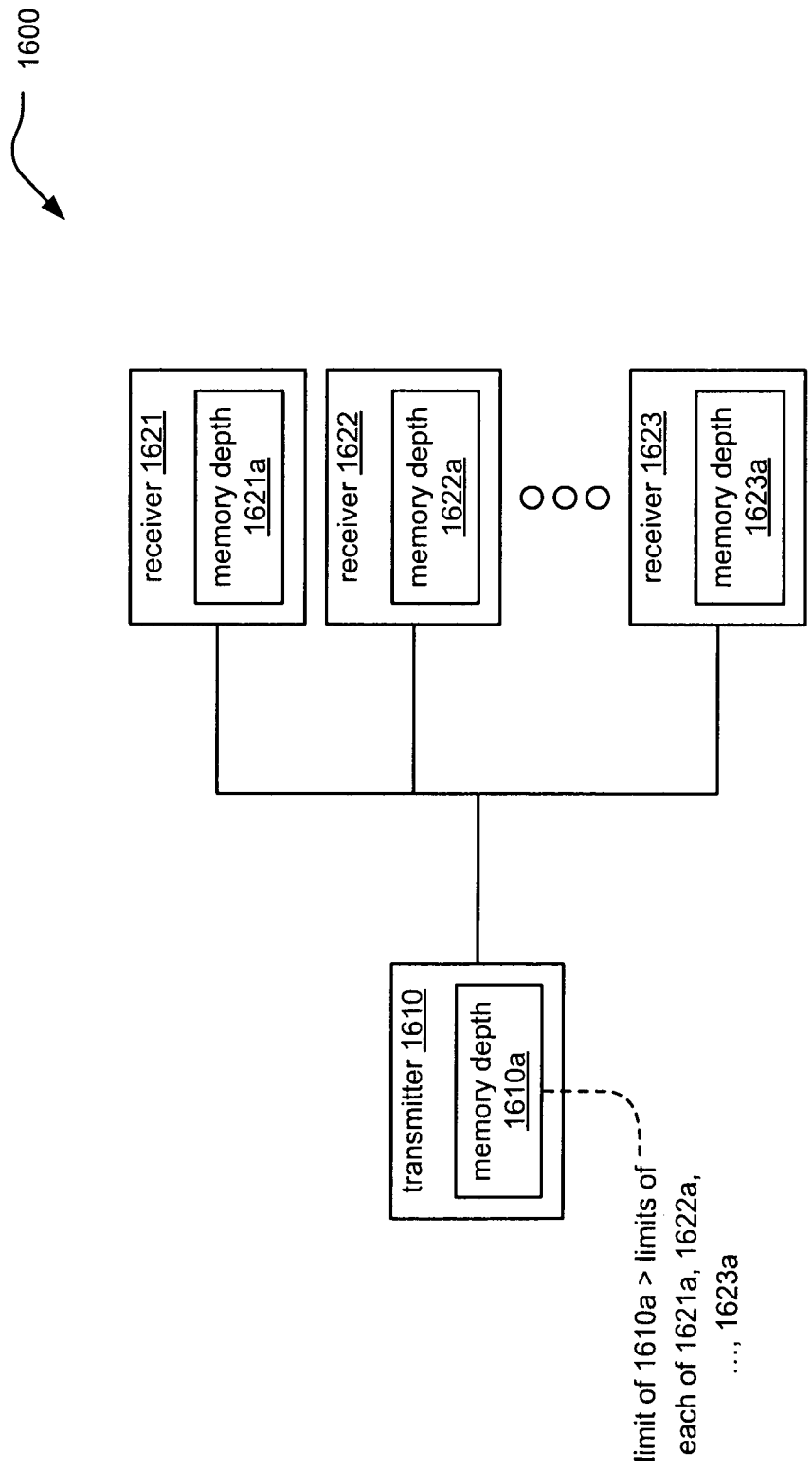
FIG. 16 illustrates an embodiment of a communication system including a transmitter communication device transmitting to multiple receiver communication devices.

FIG. 16 illustrates an embodiment of a communication system 1600 including a transmitter communication device transmitting to multiple receiver communication devices. This embodiment shows a number of communication devices (transmitters and receivers operating by using a shared network segment/communication link (which may be a single communication channel or multiple communication channels, etc.). Each of the receiver communication devices 1621, 1622, and up to 1623 includes a corresponding memory depth 1621*a*, 1622*a*, and up to 1623*a*. A transmitter communication device 1610 also includes a corresponding memory depth 1610*a*. The provisioned memory depth 1610*a* within the transmitter communication device 1610 is larger than any one of the memory depth 1621*a*, 1622*a*, and up to 1623*a* within the receiver communication devices 1621, 1622, and up to 1623. In other words, there is not a one to one match between the provisioned memory depth associated with each respective communication pathway that may be effectuated within the communication system 1600.

In one embodiment, this could allow for the transmitter communication device 1610 to support communications with more than one of the receiver communication device 1621, 1622, and up to 1623 at a same time (e.g., providing first signal to receiver communication device 1621 and second signal to receiver communication device 1622, etc.).

Figure 17:
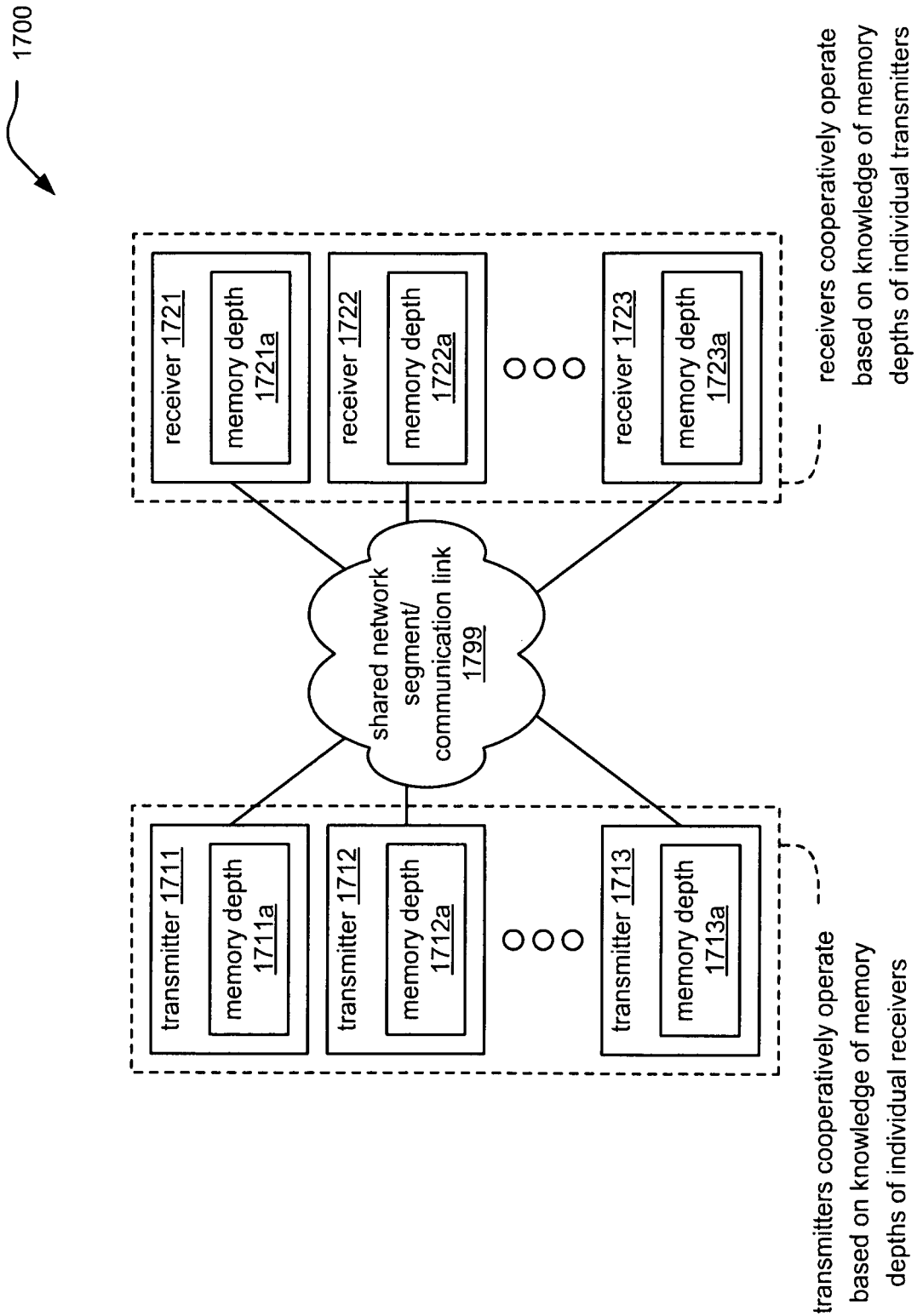
FIG. 17 illustrates an embodiment of a communication system including multiple transmitter communication devices operating in conjunction with multiple receiver communication devices.

FIG. 17 illustrates an embodiment of a communication system 1700 including multiple transmitter communication devices operating in conjunction with multiple receiver communication devices.

This embodiment shows a number of communication devices (transmitters and receivers operating by using a shared network segment/communication link 1799 (which may be a single communication channel or multiple communication channels, etc.). Each of the transmitter communication devices 1711, 1712, and up to 1713 includes a corresponding memory depth 1711*a*, 1712*a*, and up to 1713*a*. Analogously, each of the receiver communication devices 1721, 1722, and up to 1723 includes a corresponding memory depth 1721*a*, 1722*a*, and up to 1723*a*.

In one embodiment, each of the transmitter communication devices 1711, 1712, and up to 1713 operate cooperatively based on knowledge of memory depths of the individual receivers with which they communicate. Also, in another embodiment, each of the receiver communication devices 1721, 1722, and up to 1723 operate cooperatively based on knowledge of memory depths of the individual transmitters form which they receive communicates.

In other words, the shared network segment/communication link 1799 may itself be viewed as being one operational parameter by which memory depth may be defined. Corporately, there may be viewed as a memory depth that spans across the various transmitter communication devices 1711, 1712, and up to 1713. Similarly, there may be viewed as a memory depth that spans across the various receiver communication devices 1721, 1722, and up to 1723.

From certain perspectives, this may be viewed as a network application context in which the principles of memory depth optimization as presented herein may be applied across multiple communication devices operating within a communication system. The subsequent communication system 1800 described yet another embodiment by which memory depth optimization may be applied across multiple communication devices operating within a communication system.

Figure 18:
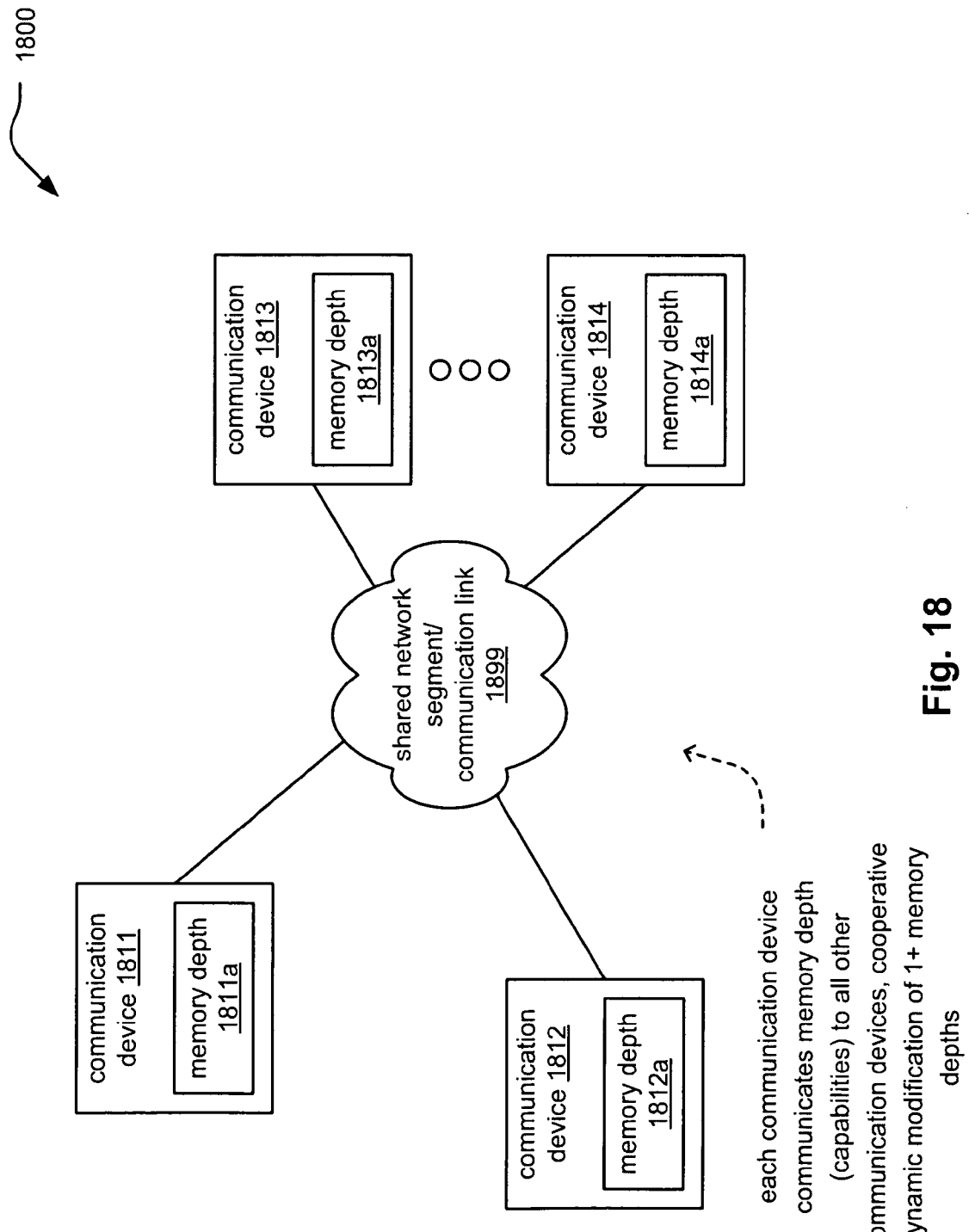
FIG. 18 illustrates an embodiment of a communication system including a multiple communication devices operating in conjunction with one another.

FIG. 18 illustrates an embodiment of a communication system 1800 including a multiple communication devices operating in conjunction with one another. This embodiment shows a number of communication devices (each being a transceiver communication device operating by using a shared network segment/communication link 1899 (which may be a single communication channel or multiple communication channels, etc.). Each of the transceiver communication devices 1811, 1812, 1813, and up to 1814 includes a corresponding memory depth 1811a, 1812a, 1813a, and up to 1814a. Each transceiver communication device 1811, 1812, 1813, and up to 1814 being a transceiver in nature, each of these communication devices can support bi-directional communications between any other of the communication devices.

In one embodiment, each of the transceiver communication devices 1811, 1812, 1813, and up to 1814 communicates its respective memory depth (capabilities) to other of the transceiver communication devices within the communication system 1800 (or at least those with which it can communicate). In doing so, intelligent cooperation and optimization of their respective memory depths may be made among multiple transceiver communication devices within the communication system 1800.

In this embodiment, as within others described herein, the memory depth of any one or more of the devices within a system may be dynamically adjusted in response to any number of operational parameters.

It is noted that using the various aspects of memory optimization as presented herein ensures a means by which memory depth may be provisioned within transmitters, receivers, or both with far less resources (e.g., memory resources) than otherwise would be required if a brute force adherence to allocating service flows was allowed (e.g., where dedicated provisioned hardware/resources are allocated to accommodate each and every service flow).

Again, there are a wide variety operational parameters that govern and define memory depth for a particular communication link, it is noted that memory depth is a parameter that can be a substantial part of cost or complexity in a transmitter or receiver, and it is advantageous to place a limit on the memory depth that is required in the transmitter, receiver, or both, as a stand-alone constraint in a system which supports multiple service flows "simultaneously". This may be compared to the relatively high complexity and significant burden in a device that requires that the maximum possible memory depth be provisioned to effectuate operation for all signals/service flows in view of all other considerations.

It is noted that the various modules (e.g., encoding modules, decoding modules, transmitter modules, receiver modules, interleaver modules, memory optimization modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus comprising:
an encoder to encode a plurality of information bits in accordance with any one of a plurality of memory depths thereby generating a plurality of signals;
a processor, coupled to the encoder, to perform memory optimization including selecting a corresponding memory depth employed by the encoder for generating each of the plurality of signals; and
a transmitter, coupled to at least one communication channel, to transmit the plurality of signals respectively via a plurality of service flows, wherein the plurality of memory depths is limited by a predetermined total memory depth that allows at least one but less than all of the plurality of signals to be encoded in accordance with a maximum per signal memory depth.

2. The apparatus of claim 1, wherein:
the processor is coupled to the transmitter; and
based on the predetermined total memory depth, the processor directs the transmitter to:
transmit a first service flow of the plurality of service flows at a first bit rate; and transmit a second service flow of the plurality of service flows at a second bit rate.

3. The apparatus of claim 1, wherein:
based on the predetermined total memory depth, the processor directs the encoder to:
encode at least some of the plurality of information bits in accordance with a first memory depth thereby generating a first signal of the plurality of signals; and
encode at least some of the plurality of information bits in accordance with a second memory depth thereby generating a second signal of the plurality of signals.

4. The apparatus of claim 3, wherein:
the first memory depth includes at least one of a first code rate, a first block size, a first symbol mapping, a first interleaver depth, and a first bit rate; and
the second memory depth includes at least one of a second code rate, a second block size, a second symbol mapping, a second interleaver depth, and a second bit rate.

5. The apparatus of claim 3, wherein:
the first memory depth includes a first code rate, a first block size, a first symbol mapping, a first interleaver depth, and a first bit rate; and
the second memory depth includes a second code rate, a second block size, a second symbol mapping, a second interleaver depth, and a second bit rate.

6. The apparatus of claim 1, wherein the encoder further comprises a variable interleaver, wherein:
the variable interleaver is operative to interleave the plurality of information bits in accordance with any one of a plurality of interleaver memory depths; and
based on the predetermined total memory depth, the processor selects a corresponding interleaver memory depth employed by the variable interleaver for interleaving at least some of the plurality of information bits.

7. The apparatus of claim 1, wherein the encoder further comprises a plurality of interleavers, wherein:
a first interleaver of the plurality of interleavers is operative to interleave a first portion of the plurality of information bits in accordance with a first interleaver memory depth;
a second interleaver of the plurality of interleavers is operative to interleave a second portion of the plurality of information bits in accordance with a second interleaver memory depth; and
based on the predetermined total memory depth, the processor selects the first interleaver memory depth and the second interleaver memory depth.

8. The apparatus of claim 1, wherein the encoder further comprises a symbol mapper, wherein:
each of the plurality of signals includes a corresponding plurality of symbols;
the symbol mapper is operative to map each symbol of each of the corresponding plurality of symbols to a respective constellation having a corresponding mapping of constellation points therein; and
based on the predetermined total memory depth, the processor selects a constellation and corresponding mapping by which at least one symbol of at least one of the corresponding plurality of symbols is mapped.

9. The apparatus of claim 8, wherein at least two symbols of the corresponding plurality of symbols are mapped to a common, respective constellation having a corresponding mapping of constellation points therein.

10. The apparatus of claim 1, wherein:
the encoder is operative to:
encode a first portion of the plurality of information bits thereby generating a first codeword having a first codeword size; and
encode a second portion of the plurality of information bits thereby generating a second codeword having a second codeword size;
each of the plurality of memory depths, by which the encoder is operative to perform encoding, corresponds to a respective codeword size; and
based on the predetermined total memory depth, the processor selects the first codeword size and the second codeword size.

11. The apparatus of claim 1 further comprising:
a plurality of encoders, and wherein:
the processor is coupled to each of the plurality of encoders;
the encoder is one of the plurality of encoders;
a first encoder of the plurality of encoders is operative to encode a first portion of the plurality of information bits thereby generating a first codeword having a first codeword size;
a second encoder of the plurality of encoders is operative to encode a second portion of the plurality of information bits thereby generating a second codeword having a second codeword size;
each of the plurality of memory depths, by which each of the plurality of encoders is operative to perform encoding, corresponds to a respective codeword size; and
based on the predetermined total memory depth, the processor selects the first codeword size and the second codeword size.

12. The apparatus of claim 1, wherein:
the encoder is a variable code rate encoder that is operative to:
encode a first portion of the plurality of information bits in accordance with a first code rate thereby generating a first codeword; and
encode a second portion of the plurality of information bits in accordance with a second code rate thereby generating a second codeword having a second codeword size;
each of the plurality of memory depths, by which the variable code rate encoder is operative to perform encoding, corresponds to a respective code rate; and
based on the predetermined total memory depth, the processor selects the first code rate and the second code rate.

13. The apparatus of claim 1, wherein:
during a first time, the encoder is operative to:
encode a first portion of the plurality of information bits using the maximum per signal memory depth thereby generating a first signal to be transmitted via a first service flow;
encode a second portion of the plurality of information bits using a memory depth that is less than the maximum per signal memory depth thereby generating a second signal to be transmitted via a second service flow; and
during a second time, the encoder is operative to:
encode a third portion of the plurality of information bits using the memory depth that is less than the maximum per signal memory depth thereby generating a third signal to be transmitted via the first service flow; and
encode a fourth portion of the plurality of information bits using the maximum per signal memory depth thereby generating a fourth signal to be transmitted via the second service flow.

14. The apparatus of claim 1, wherein:
the apparatus is a communication device;
the communication device is coupled to a plurality of communication channels; and each of the plurality of service flows is transmitted respectively via a corresponding one of the plurality of communication channels.

15. The apparatus of claim 1, wherein:
the apparatus is a communication device;
the communication device is coupled to a one communication channel; and
all of the plurality of service flows are transmitted via the one communication channel.

16. The apparatus of claim 1, wherein:
the apparatus is coupled to at least one additional apparatus via one communication channel;
the apparatus transmits the plurality of service flows to the at least one additional apparatus via the one communication channel;
the at least one additional apparatus provides a feedback signal to the apparatus indicating a current processing status of the at least one additional apparatus; and
based on the feedback signal, the processor modifies at least one corresponding memory depth employed by the encoder for generating at least one of the plurality of signals.

17. An apparatus comprising:
an encoder to encode a plurality of information bits in accordance with any one of a first plurality of memory depths thereby generating a first plurality of signals;
an interleaver to interleave the first plurality of signals in accordance with any one of a second plurality of memory depths thereby generating a second plurality of signals, wherein:
a transmitter, coupled to at least one communication channel, to transmit the second plurality of signals respectively via a plurality of service flows; and
a processor, coupled to the encoder and the interleaver, to:
  select a respective memory depth from the first plurality of memory depths employed by the encoder for generating each respective signal of the first plurality of signals; and
  select a respective memory depth from the second plurality of memory depths employed by the interleaver for generating each respective signal of the second plurality of signals, wherein the first plurality of memory depths and the second plurality of memory depths are limited by a predetermined total memory depth that allows at least one but less than all of the first plurality of signals and at least one but less than all of the second plurality of signals to be generated in accordance with a maximum per signal memory depth.

18. The apparatus of claim 17, wherein:
the processor is coupled to the transmitter; and
based on the predetermined total memory depth, the processor directs the transmitter m to:
  transmit a first service flow of the plurality of service flows at a first bit rate; and
  transmit a second service flow of the plurality of service flows at a second bit rate.

19. The apparatus of claim 17, wherein each memory depth of the first plurality of memory depths includes at least one of a respective code rate and a respective block size.

20. The apparatus of claim 17 further comprising a symbol mapper, coupled to the transmitter, wherein:
each of the second plurality of signals includes a corresponding plurality of symbols;
the symbol mapper is operative to map each symbol of each of the corresponding plurality of symbols to a respective constellation having a corresponding mapping of constellation points therein; and
based on the predetermined total memory depth, the processor selects a constellation and corresponding mapping by which at least one symbol of at least one of the corresponding plurality of symbols is mapped.

21. The apparatus of claim 17, wherein:
the apparatus is a communication device;
the communication device is coupled to a plurality of communication channels; and
each of the plurality of service flows is transmitted respectively via a corresponding one of the plurality of communication channels.

22. The apparatus of claim 17, wherein:
the apparatus is a communication device;
the communication device is coupled to a one communication channel; and
all of the plurality of service flows are transmitted via the one communication channel.

23. The apparatus of claim 17, wherein:
the apparatus is coupled to at least one additional apparatus via a one communication channel;
the apparatus transmits the plurality of service flows to the at least one additional apparatus via the one communication channel;
the at least one additional apparatus provides a feedback signal to the apparatus indicating a current processing status of the at least one additional apparatus; and
based on the feedback signal, the processor modifies at least one corresponding memory depth of the first plurality of memory depths employed by the encoder for generating at least one of the first plurality of signals or at least one corresponding memory depth of the second plurality of memory depths employed by the interleaver for generating at least one of the second plurality of signals.

24. An apparatus, comprising:
an encoder that is operative to encode a plurality of information bits in accordance with any one of a first plurality of memory depths thereby generating a first plurality of signals;
an interleaver module that is operative to interleave the first plurality of signals in accordance with any one of a second plurality of memory depths thereby generating a second plurality of signals, wherein:
a transmitter, coupled to at least one communication channel, to transmit the second plurality of signals respectively via a plurality of service flows in accordance with any one of a third plurality of memory depths; and
a processor, coupled to the encoder, the interleaver module, and the transmitter, that:
  selects a respective memory depth from the first plurality of memory depths employed by the encoder for generating each respective signal of the first plurality of signals; and
  selects a respective memory depth from the second plurality of memory depths employed by the interleaver module for generating each respective signal of the second plurality of signals; and
  selects a respective memory depth from the third plurality of memory depths employed by the transmitter for supporting each respective service flow of the plurality of service flows, wherein the first plurality of memory depths, the second plurality of memory depths, and the third plurality of memory depths are limited by a predetermined total memory depth that allows less than all of the first plurality of signals and less than all of the second plurality of signals to be generated in accordance with a maximum per signal memory depth and that allows at least one but less than all of the plurality of service flows to be supported in accordance with the maximum per signal memory depth.

25. The apparatus of claim 24, wherein:
each memory depth of the first plurality of memory depths includes at least one of a respective code rate and a respective block size;
each memory depth of the second plurality of memory depths corresponds to a respective interleaver depth; and
each memory depth of the third plurality of memory depths corresponds to a respective bit rate.

26. The apparatus of claim 24 further comprising a symbol mapper, coupled to the transmitter, wherein:
each of the second plurality of signals includes a corresponding plurality of symbols;
the symbol mapper is operative to map each symbol of each of the corresponding plurality of symbols to a respective constellation having a corresponding mapping of constellation points therein; and
based on the predetermined total memory depth, the processor selects a constellation and corresponding mapping by which at least one symbol of at least one of the corresponding plurality of symbols is mapped.

27. The apparatus of claim 24, wherein:
the apparatus is a communication device;
the communication device is coupled to a plurality of communication channels; and
each of the plurality of service flows is transmitted respectively via a corresponding one of the plurality of communication channels.

28. The apparatus of claim 24, wherein:
the apparatus is a communication device;
the communication device is coupled to one communication channel; and
all of the plurality of service flows are transmitted via the one communication channel.

29. The apparatus of claim 24, wherein:
the apparatus is coupled to at least one additional apparatus via one communication channel;
the apparatus transmits the plurality of service flows to the at least one additional apparatus via the one communication channel;
the at least one additional apparatus provides a feedback signal to the apparatus indicating a current processing status of the at least one additional apparatus; and
based on the feedback signal, the processor modifies at least one corresponding memory depth of the first plurality of memory depths employed by the encoder for generating at least one of the first plurality of signals, at least one corresponding memory depth of the second plurality of memory depths employed by the interleaver module for generating at least one of the second plurality of signals, or at least one corresponding memory depth of the third plurality of memory depths employed by the transmitter for supporting at least one of the plurality of service flows.

* * * * *